US010770473B2

(12) United States Patent
Lee et al.

(10) Patent No.: US 10,770,473 B2
(45) Date of Patent: Sep. 8, 2020

(54) VERTICAL TYPE SEMICONDUCTOR DEVICES AND METHODS OF MANUFACTURING THE SAME

(71) Applicant: Samsung Electronics Co., Ltd., Suwon-si, Gyeonggi-do (KR)

(72) Inventors: Sung-Yun Lee, Seongnam-si (KR); Jae-Hoon Jang, Seongnam-si (KR); Jae-Duk Lee, Seongnam-si (KR); Joon-Hee Lee, Seongnam-si (KR); Young-Jin Jung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 37 days.

(21) Appl. No.: 16/122,037

(22) Filed: Sep. 5, 2018

(65) Prior Publication Data
US 2019/0164989 A1 May 30, 2019

(30) Foreign Application Priority Data

Nov. 27, 2017 (KR) .......................... 10-2017-0159648

(51) Int. Cl.
| H01L 27/11556 | (2017.01) |
| H01L 27/11582 | (2017.01) |
| H01L 21/768 | (2006.01) |
| H01L 21/308 | (2006.01) |
| H01L 21/28 | (2006.01) |
| H01L 27/11565 | (2017.01) |

(52) U.S. Cl.
CPC ...... *H01L 27/11582* (2013.01); *H01L 21/308* (2013.01); *H01L 21/76837* (2013.01); *H01L 27/11556* (2013.01); *H01L 29/40117* (2019.08); *H01L 27/11565* (2013.01)

(58) Field of Classification Search
CPC ..................... H01L 27/11556; H01L 27/11582
See application file for complete search history.

(56) References Cited

U.S. PATENT DOCUMENTS

| 6,835,649 B2 | 12/2004 | Lee et al. |
| 8,609,491 B2 | 12/2013 | Hwang |
| 9,224,753 B2 | 12/2015 | Lim et al. |
| 9,240,347 B2 | 1/2016 | Chandrashekar et al. |
| 2002/0113273 A1 | 8/2002 | Hwang et al. |
| 2016/0049419 A1 | 2/2016 | Lee et al. |
| 2016/0351497 A1 | 12/2016 | Peri et al. |
| 2017/0062470 A1 | 3/2017 | Han et al. |

(Continued)

FOREIGN PATENT DOCUMENTS

KR  10-2001-0061017 A  7/2001

*Primary Examiner* — Mark V Prenty
(74) *Attorney, Agent, or Firm* — Harness, Dickey & Pierce, P.L.C.

(57) ABSTRACT

A vertical type semiconductor device includes insulation patterns on a substrate and spaced apart from each other in a first direction perpendicular to a top surface of the substrate, a channel structure on the substrate and penetrating through the insulation patterns, a first conductive pattern partially filling a gap between the insulation patterns adjacent to each other in the first direction and the channel structure and having a slit in a surface thereof, the slit extending in a direction parallel with the top surface of the substrate, and a second conductive pattern on the first conductive pattern in the gap and filling the slit.

20 Claims, 24 Drawing Sheets

(56) References Cited

U.S. PATENT DOCUMENTS

| | | |
|---|---|---|
| 2017/0062472 A1 | 3/2017 | Park et al. |
| 2017/0069637 A1 | 3/2017 | Son et al. |
| 2017/0148806 A1 | 5/2017 | Noda et al. |
| 2017/0154894 A1 | 6/2017 | Yoshimizu et al. |
| 2019/0164989 A1* | 5/2019 | Lee .................. H01L 29/40117 |

* cited by examiner

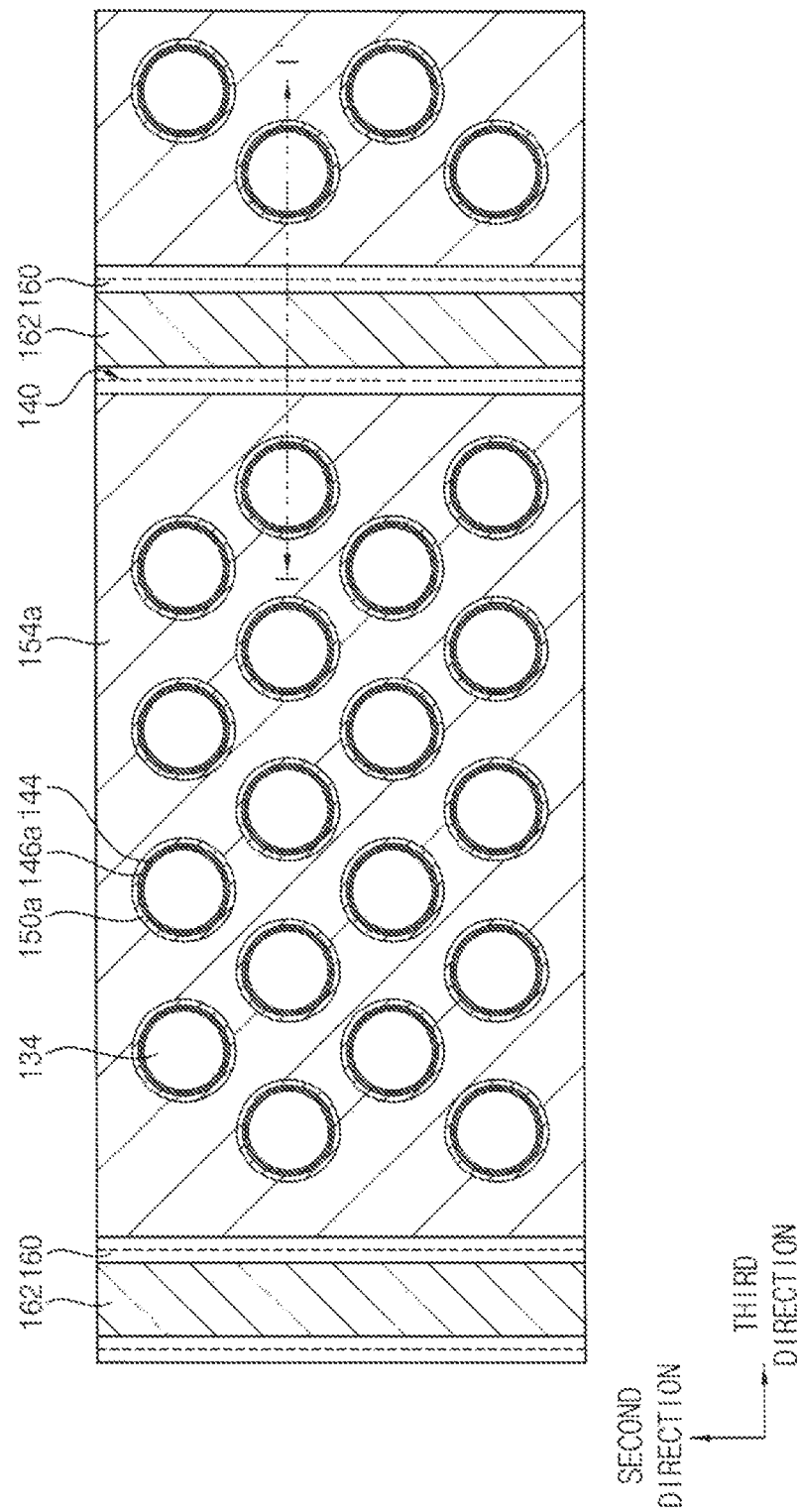

VERTICAL TYPE SEMICONDUCTOR DEVICES AND METHODS OF MANUFACTURING THE SAME

CROSS-REFERENCE TO RELATED APPLICATION

This application claims priority under 35 USC § 119 to Korean Patent Application No. 10-2017-0159648, filed on Nov. 27, 2017 in the Korean Intellectual Property Office (KIPO), the contents of which are herein incorporated by reference in their entirety.

BACKGROUND

1. Field

Example embodiments relate to semiconductor devices and methods of manufacturing the same. More particularly, example embodiments relate to vertical type semiconductor devices and methods of manufacturing the same.

2. Description of the Related Art

In a vertical type semiconductor device, a channel layer of a channel structure may be electrically connected to a substrate. However, as an aspect ratio of the channel structure increases, an electrical connection between the channel layer and the substrate may be difficult.

SUMMARY

Example embodiments provide a vertical type semiconductor device including gate structures.

According to example embodiments, there is provided a vertical type semiconductor device. The vertical type semiconductor device includes insulation patterns on a substrate and spaced apart from each other in a first direction perpendicular to a top surface of the substrate, a channel structure on the substrate and penetrating through the insulation patterns, a first conductive pattern partially filling a gap between the insulation patterns adjacent to each other in the first direction and the channel structure and having a slit in a surface thereof, the slit extending in a direction parallel with the top surface of the substrate, and a second conductive pattern on the first conductive pattern in the gap and filling the slit.

According to example embodiments, there is provided a vertical type semiconductor device. The vertical type semiconductor device includes insulation patterns on a substrate and spaced apart from each other in a first direction perpendicular to a top surface of the substrate, the insulation pattern extending a second direction parallel to the top surface of the substrate, channel structures on the substrate, each channel structure penetrating through the insulation patterns, and a gate structure in a gap between the insulation patterns adjacent to each other in the first direction and the channel structure, the gate structure extending in the second direction. The gate structure includes a first conductive pattern along a top surface and a bottom surface of the insulation patterns and the channel structure and having a slit in a surface thereof, and a second conductive pattern on the first conductive pattern to filling the slit and including a material different from the first conductive pattern.

According to example embodiments, there is provided a vertical type semiconductor device. The vertical type semiconductor device includes pattern structures including gate structures and insulation patterns alternately and repeatedly stacked on a substrate in a first direction perpendicular to a top surface of the substrate, channel structures penetrating through the insulation patterns, and a common source line between the pattern structures, extending in a second direction parallel with the top surface of the substrate and contacting the substrate. The gate structure includes a first conductive pattern having a slit extending in a direction parallel with the top surface of the substrate, and a second conductive pattern on the first conductive pattern filling the slit.

According to example embodiments, a gate structure in each level may include a first conductive pattern having a slit and a second conductive pattern filling the slit. Accordingly, an empty space may not be formed in the gate structure. Therefore, the insulation pattern may be reduced or prevented from being inclined or bended due to the empty space. Further, since the insulation pattern is formed to be structurally stable, a short circuit failure between the gate structures arranged on and under the insulation patterns may be reduced or prevented.

BRIEF DESCRIPTION OF THE DRAWINGS

Example embodiments will be more clearly understood from the following detailed description taken in conjunction with the accompanying drawings. FIGS. 1 to 23 represent non-limiting, example embodiments as described herein.

FIGS. 1, 2A, 2B and 3 are plan views and cross-sectional views illustrating a vertical type semiconductor device in accordance with example embodiments.

FIGS. 4 to 20 are cross-sectional views and plan views illustrating a method of manufacturing a vertical type semiconductor device in accordance with example embodiments.

FIGS. 21 and 22 are cross-sectional views illustrating a vertical type semiconductor device in accordance with example embodiments.

FIG. 23 is a cross-sectional view illustrating a method of manufacturing a vertical type semiconductor device in accordance with example embodiments.

DESCRIPTION OF EXAMPLE EMBODIMENTS

Hereinafter, example embodiments will be described more fully with the accompanying drawings.

FIGS. 1, 2A, 2B and 3 are plan views and cross-sectional views illustrating a vertical type semiconductor device in accordance with example embodiments.

Figure 1:
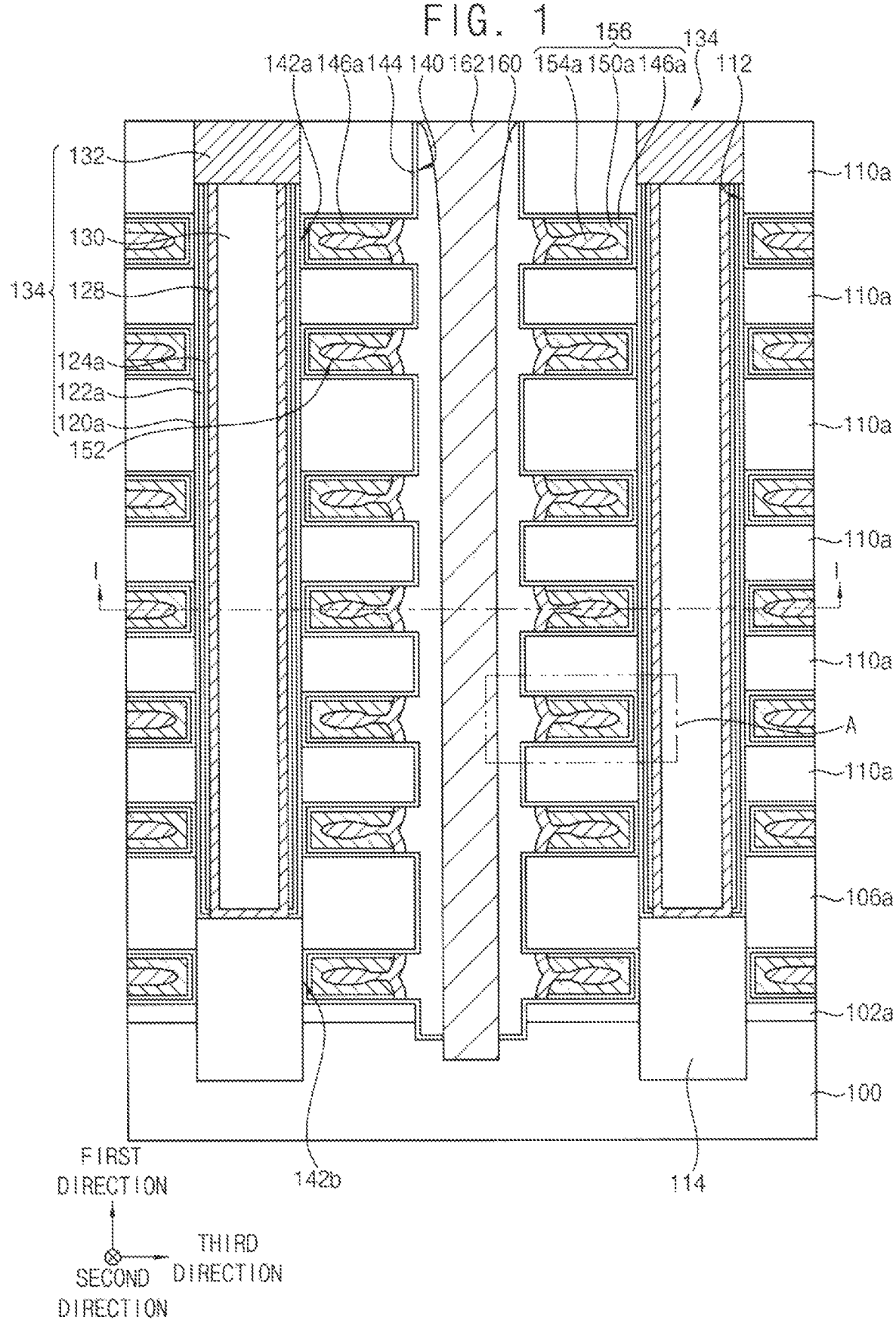
Figure 2A:
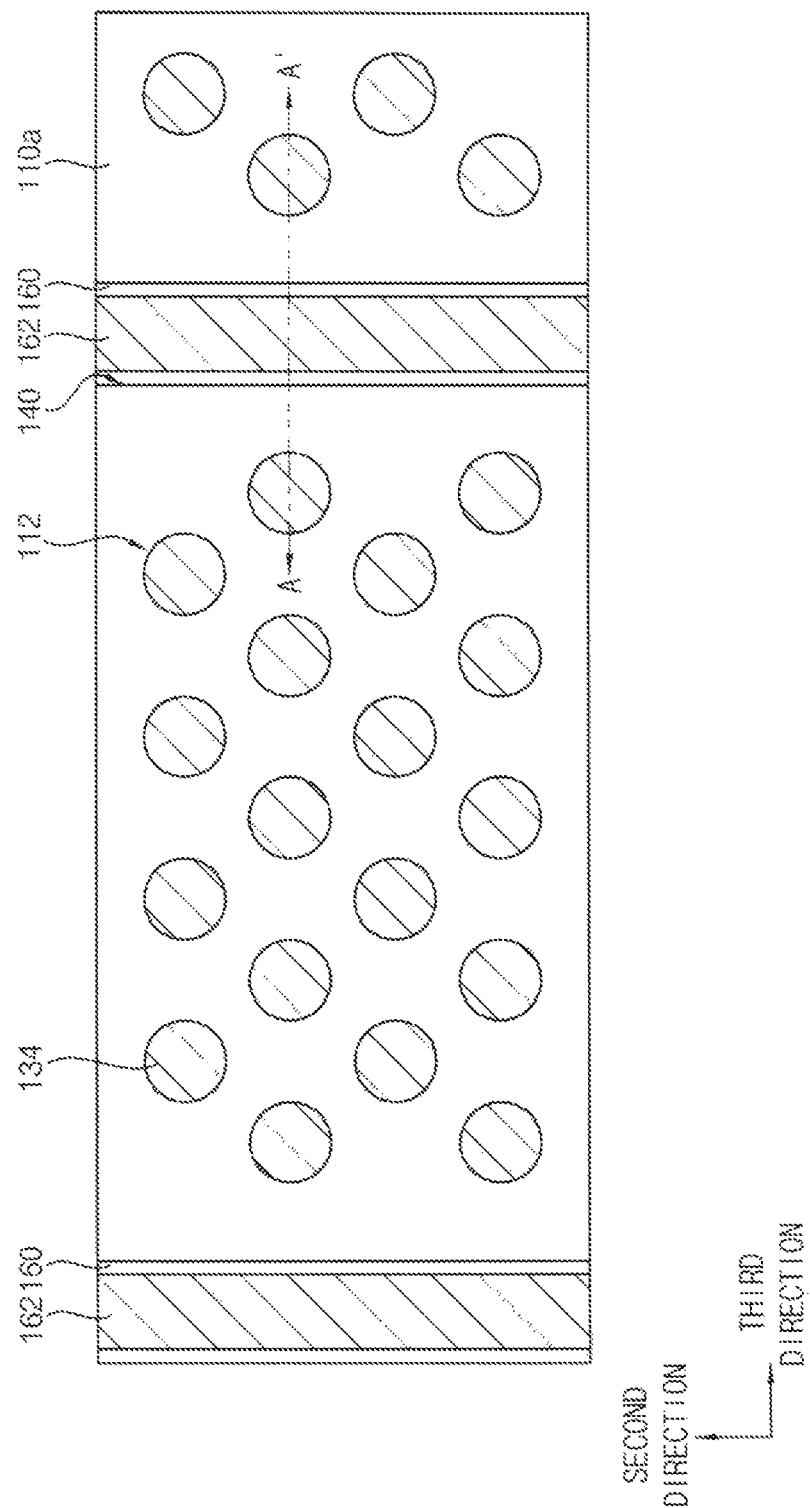
Figure 3:
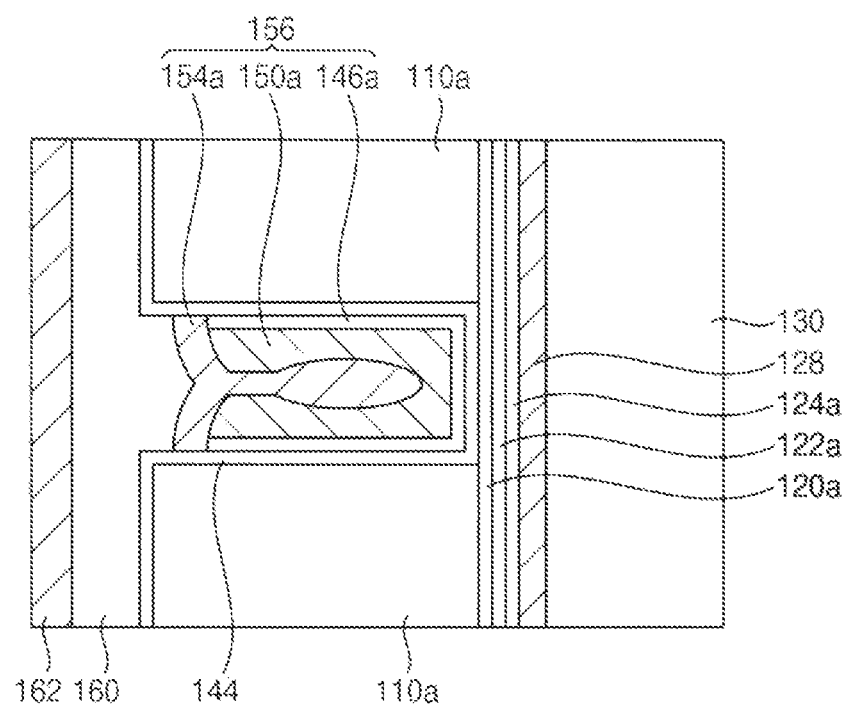

FIG. 1 is a cross-sectional view taken along a line A-A' in FIG. 2A, and FIG. 3 is an enlarged view illustrating a portion "A" in FIG. 1. FIG. 2A is a plan view illustrating the vertical type semiconductor device when viewed from the top. FIG. 2B is a plan view taken along a line I-I' in FIG. 1. That is, FIG. 2B is a plan view taken along a direction parallel with a top surface of a semiconductor substrate, which illustrates a slit portion.

In all figures in this specification, a direction substantially perpendicular to a top surface of a semiconductor substrate is referred to as a first direction, and two directions substantially parallel to the top surface of the semiconductor substrate and crossing each other are referred to as a second direction and a third direction, respectively. The first and second directions are substantially perpendicular to each other.

Referring to FIGS. 1, 2A, 2B and 3, a vertical type semiconductor device may include pattern structures including gate structures 156 and insulation patterns 102a, 106a, 110a alternately and repeatedly stacked on a semiconductor substrate 100, channel structures 134 penetrating through the pattern structures, and a common source line 162 between the pattern structures and making contact with the semiconductor substrate 100. A semiconductor pattern 114 may be provided between the semiconductor substrate 100 and the channel structure 134.

The semiconductor substrate 100 may include a semiconductor material such as silicon, germanium, silicon-germanium, etc., or III-V compounds such as Gap, GaAs, GaSb, etc. The semiconductor substrate 100 may be a silicon-on-insulator (SOI) substrate or germanium-on-insulator (GOI) substrate.

The pattern structure may extend in the second direction, and a plurality of the pattern structures may be arranged along the third direction. Accordingly, a trench 140 may be provided between the pattern structures to extend in the second direction. The trench 140 may expose the semiconductor substrate 100.

The channel structure 134 may penetrate through the pattern structure and extend in the first direction.

In example embodiments, the channel structure 134 may be provided on the semiconductor pattern 114 which protrudes from the semiconductor substrate 100 in the first direction. In some example embodiments, although it is not illustrated in the figures, the channel structure 134 may make contact with the semiconductor substrate 100.

The channel structure 134 may be formed within a channel hole 112 which penetrates through the pattern structure. The channel structure 134 may include a first blocking pattern 120a, a charge storage pattern 122a, a tunnel insulation pattern 124a, a channel pattern 128, a buried insulation pattern 130 and the pad pattern.

The first blocking pattern 120a, the charge storage pattern 122a, the tunnel insulation pattern 124a may be sequentially stacked on a sidewall of the channel hole 112. The channel pattern 128 may be formed along surfaces of the tunnel insulation pattern 124a and the semiconductor pattern 114. Accordingly, the channel pattern 128 may have a cylindrical shape. The channel pattern 128 may be electrically connected to the semiconductor substrate 100 through the semiconductor pattern 114. The buried insulation pattern 130 may be provided on the channel pattern 128, and may completely fill the channel hole 112.

The tunnel insulation pattern 124a, the first blocking pattern 120a and the buried insulation pattern 130 may include an oxide such as silicon oxide, and the charge storage pattern 122a may include a nitride such as silicon nitride. The channel pattern 128 may include, for example, polysilicon.

The pad pattern 132 may be provided on the first blocking pattern 120a, the charge storage pattern 122a, the tunnel insulation pattern 124a, the channel pattern 128 and the buried insulation pattern 130 in an upper portion of the channel hole 112. The pad pattern 130 may include, for example, polysilicon. Although it is not illustrated in the figures, a contact plug and a bit line may be further provided on the pad pattern 132.

In the pattern structure, the insulation patterns 102a, 106a, 110a may be provided on the semiconductor substrate 100, and may be arranged to be spaced apart from the each other in the first direction.

The insulation patterns 102a, 106a, 110a may include a pad insulation pattern 102a, a first insulation pattern 106a and second insulation patterns 110a. The pad insulation pattern 102a, the first insulation pattern 106a and the second insulation patterns 110a may be arranged to be spaced apart from each other in the first direction. The insulation patterns 102a, 106a, 110a may extend in the second direction. The insulation patterns 102a, 106a, 110a may include silicon oxide.

The gate structure 156 may be arranged between the insulation patterns 102a, 106a, 110a adjacent to each other in the first direction. The gate structure 156 may be formed on the sidewall of the channel structure 134. The gate structure 156 may extend in the second direction.

In example embodiments, the lowermost gate structure 156 may function as a ground selection line GSL, and one or two uppermost gate structures 156 may function as a string selection line SSL. The gate structures 156 between the ground selection line and the string selection line may function as a word line.

The gate structures 156 may be formed in first gaps 142a between the second insulation patterns 110a and between the first insulation pattern 106a and the second insulation pattern 110a, and in a second gap 142b between the pad insulation pattern 102a and the first insulation pattern 106a, respectively. The gate structures 156 formed within the first and second gaps 142a, 142b may have substantially the same shape.

Hereinafter, in the first and second gaps 142a, 142b, a portion corresponding to the insulation pattern portion in an upper portion of each gap may be referred to as a first portion, a portion corresponding to the sidewall of the channel structure 134 or the semiconductor pattern 114 may be referred to as a second portion, and a portion corresponding to the insulation pattern in a lower portion of each gap may be referred to as a third portion.

The gate structure 156 may include a first conductive pattern 150a and a second conductive pattern 154a. In example embodiments, the gate structure 156 may further include a barrier pattern 146a surrounding a top surface, a sidewall and a bottom surface of the first conductive pattern 150a.

The barrier pattern 146a may be provided conformally along the first portion, the second portion and the third portion of each of the first and second gaps 142a, 142b. The barrier pattern 146a may include, for example, titanium, titanium nitride, tantalum, tantalum nitride, etc.

The first conductive pattern 150a may be provided on the barrier pattern 146a to partially fill the first and second gaps 142a, 142b. The first conductive pattern 150a may be formed along the first portion, the second portion and the third portion of each of the first and second gaps 142a, 142b, and may have a long and narrow slit 152 in a direction parallel with the top surface of the semiconductor substrate 100 between the first portion and the third portion. The slit 152 may be formed in a surface of the first conductive pattern 150a.

The slit 152 may be formed in a middle region of each of the first and second gaps 142a, 142b in the first direction.

In the first conductive pattern 150a, an entrance of the slit 152 adjacent to the trench 140 may be opened toward the trench 140. In example embodiments, the entrance of the slit 152 may have a width in the first direction less than other portions of the slit 152.

The first conductive pattern 150a may include a metal material having a low resistance. The first conducive pattern 150a may include, for example, tungsten.

The second conductive pattern 154a may be provided on the first conductive pattern 150a and the barrier pattern 146a, to cover surfaces of the first conductive pattern 150a and the barrier pattern 146a. The second conductive pattern 154a may fill the slit 152 of the first conductive pattern 150a.

The second conductive pattern 154a may be provided within the first and second gaps 142a, 142b.

The second conductive pattern 154a may include a metal or a metal nitride capable of easily filling the narrow slit 152. The second conductive pattern 154a may include, for example, titanium, titanium nitride, tantalum, tantalum nitride, etc. As an example, the second conductive pattern 154a may include titanium nitride.

In example embodiments, a second blocking layer 144 may further be provided along the sidewall of the second insulation pattern 110a and the surfaces of the first and second gaps 142a, 142b. The second blocking layer 144 may make contact with the first blocking pattern 120a of the channel structure 134. Accordingly, the first blocking pattern 120a and the second blocking layer 144 may be provided as one blocking structure. Additionally, the second blocking layer 144 may make contact with the semiconductor pattern 114.

In example embodiments, the second blocking layer 144 may include a metal oxide. The second blocking layer 144 may include, for example, aluminum oxide, zirconium oxide, hafnium oxide, etc.

As illustrated in FIG. 2B, in a plan view taken along a direction parallel with a top surface of a semiconductor substrate, which illustrates the slit portion of the gate structure 156, the second blocking layer 144 and the barrier pattern 146a may be provided on the sidewall of the channel structure 134, and the first conductive pattern 150a may be provided on the barrier pattern 146a to surround the channel structure 134. The second conductive pattern 154a may be provided on the first conductive pattern 150a.

As the second conductive pattern 154a fills the slit portion, an empty space may be removed from the gate structure 156.

In example embodiments, the gate structure 156 including the barrier pattern 146a, the first conductive pattern 150a and the second conductive pattern 154a stacked on each other may not completely fill the first and second gaps 142a, 142b. That is, a space may be provided between the sidewall of the gate structure 156 and the sidewall of the insulation patterns 102a, 106a, 110a, in the first and second gaps 142a, 142b.

The sidewall of the gate structure 156, the sidewall of the insulation patterns 102, 106a, 110a and the surface of the semiconductor substrate 100 may be exposed by the trench 140.

An insulation spacer 160 may be provided on the sidewall of the trench 140. The insulation spacer 160 may cover the sidewall of the gate structure 156 and the sidewalls of the insulation patterns 102a, 106a, 110a.

The common source line 162 may be provided on the insulation spacer 160 to fill the trench 140.

The common source line 162 may include a metal material. As an example, the common source line 162 may include tungsten.

Although it is not illustrated in the figures, a third insulation layer may be provided on the second insulation pattern 110a, the common source line 162 and the insulation spacer 160, and a contact plug may be provided to penetrate through the third insulation layer to make contact with the pad pattern. A bit line may be provided to make contact with the contact plug.

FIGS. 4 to 20 are cross-sectional views and plan views illustrating a method of manufacturing a vertical type semiconductor device in accordance with example embodiments.

Figure 5:
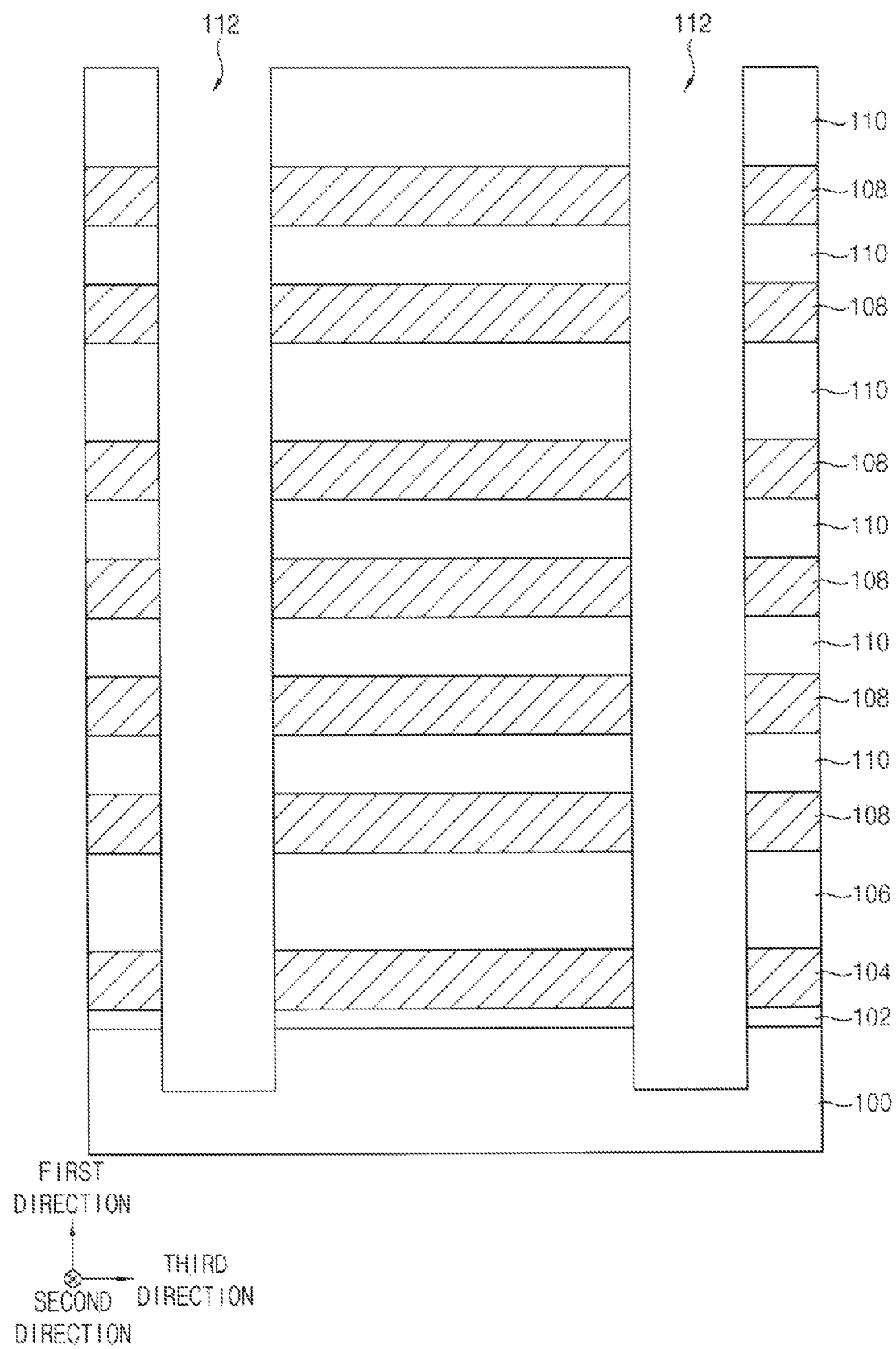
Figure 6:
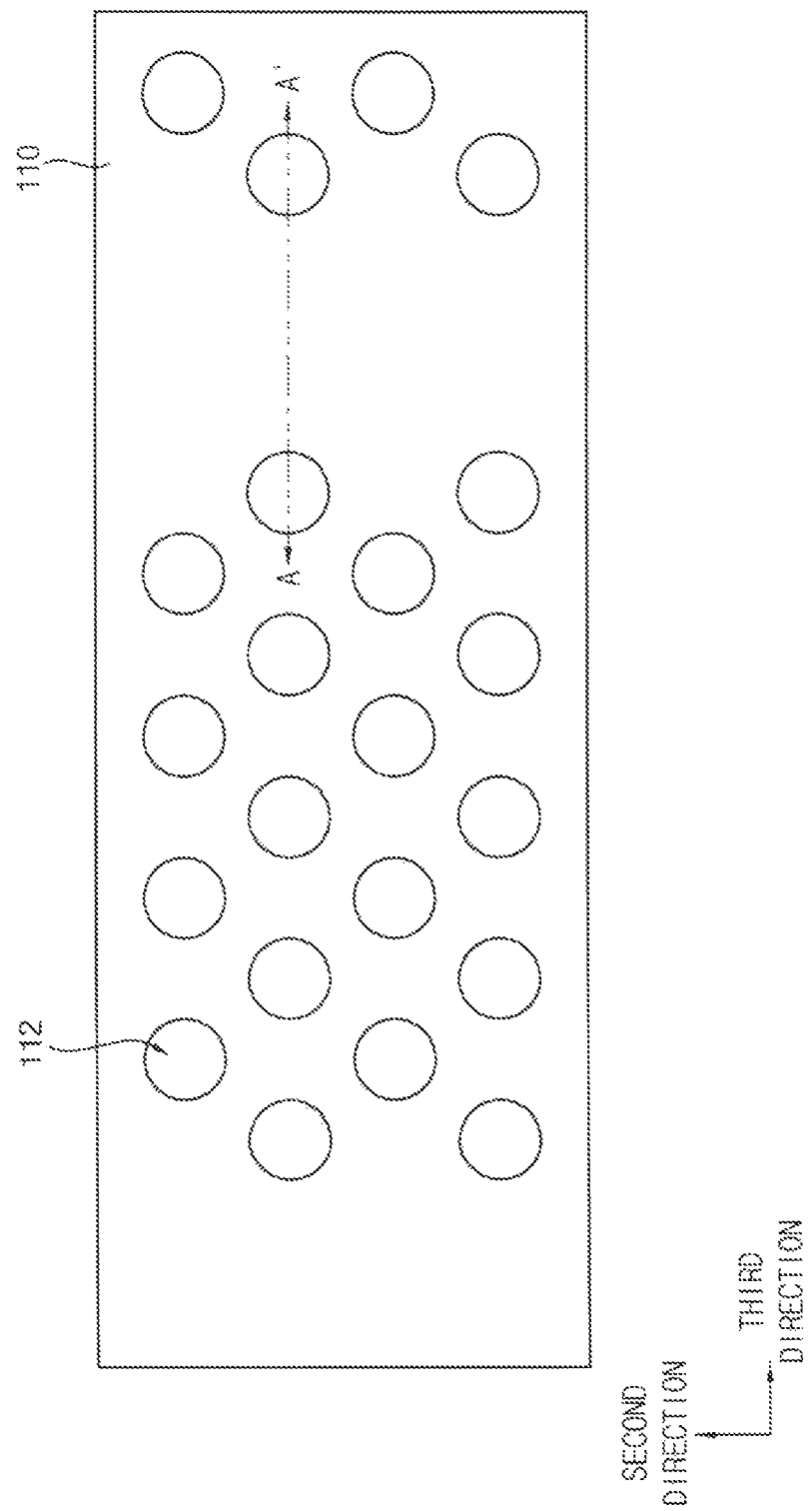
Figure 9:
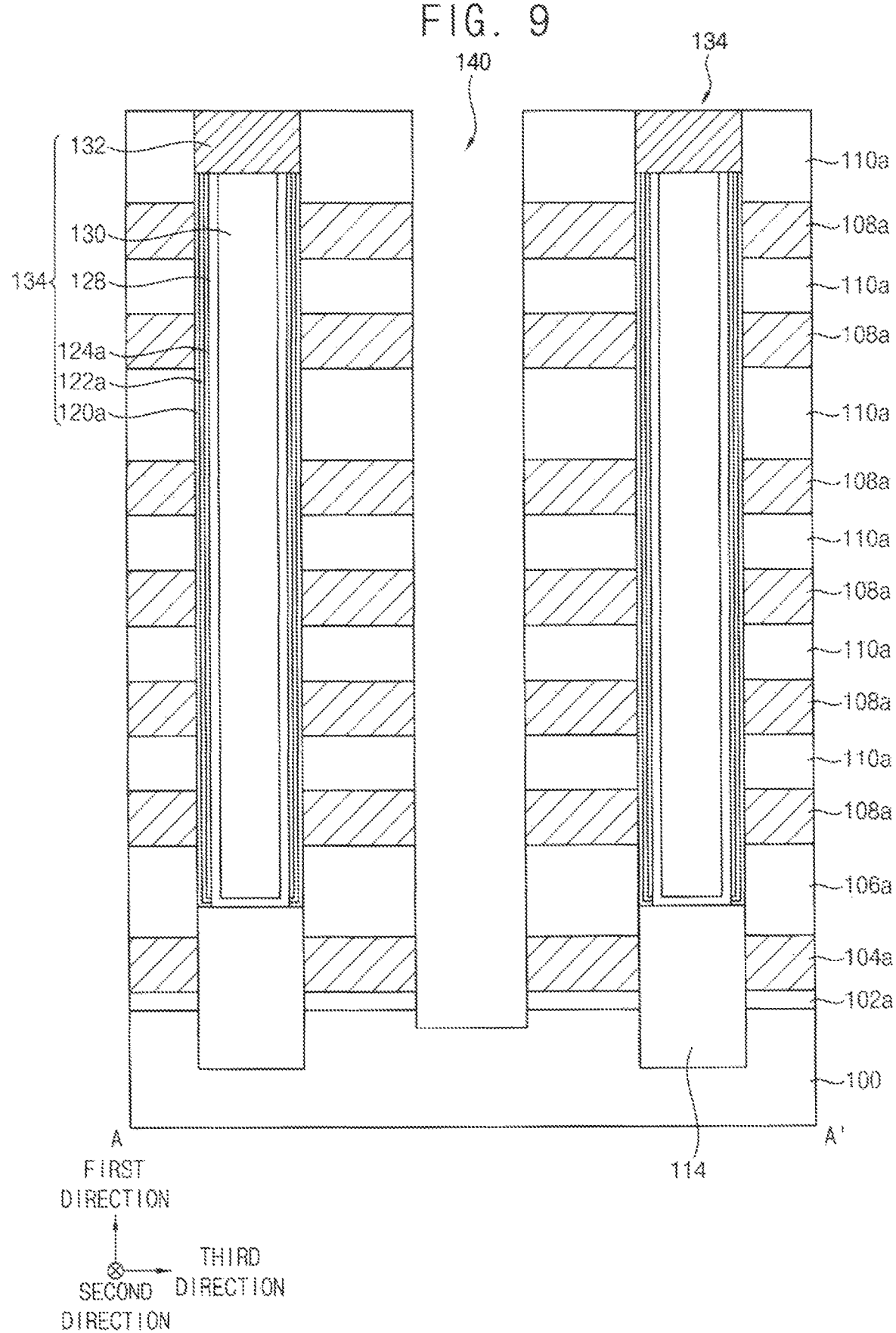
Figure 10:
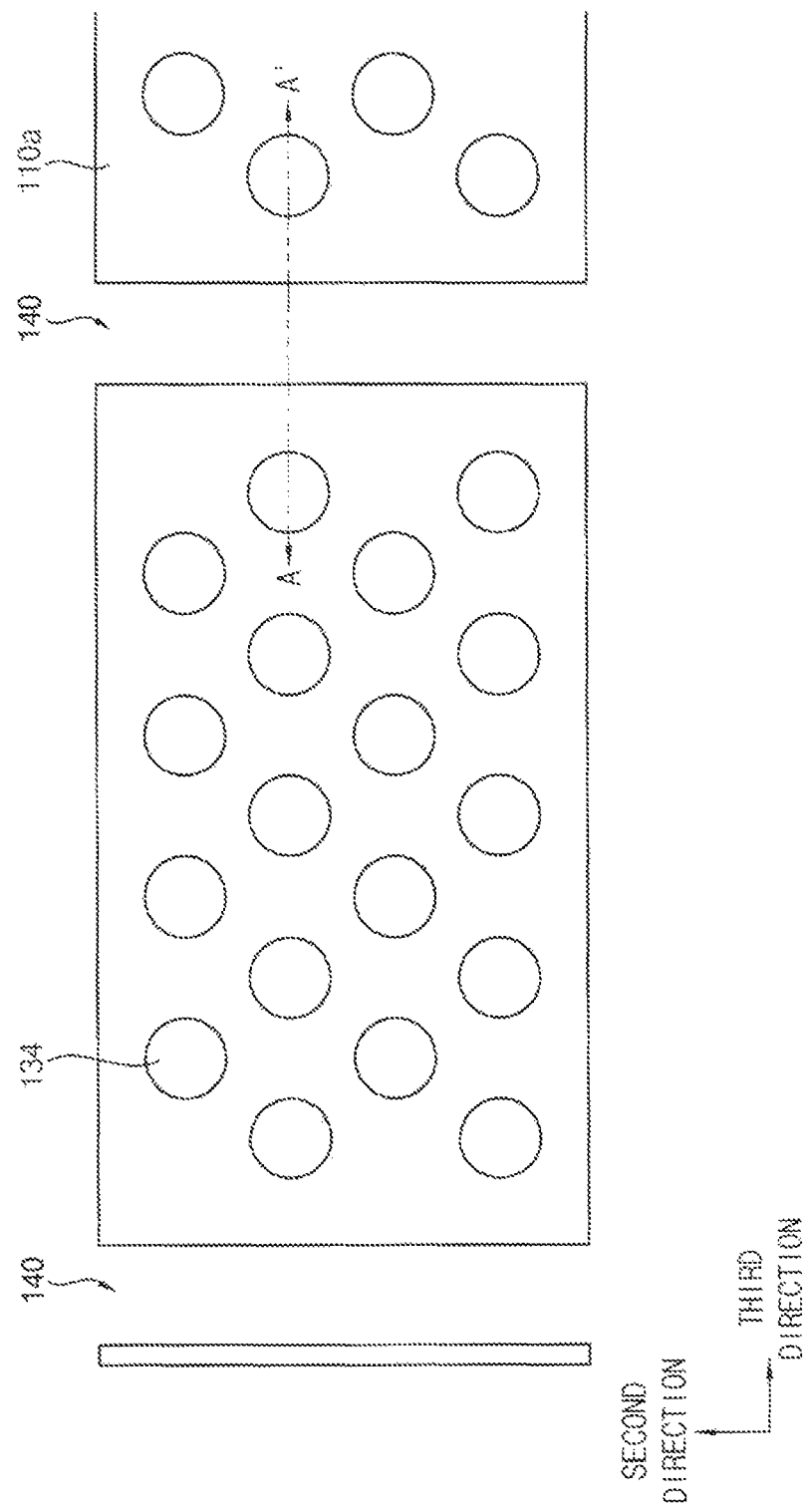

FIGS. 4, 5, 7 to 9 and 11 to 19 are cross-sectional views, and FIGS. 6 and 10 are plan views. FIGS. 14, 16 and 19 are enlarged cross-sectional views illustrating a portion "A" in FIGS. 13, 15 and 18, respectively.

Figure 4:
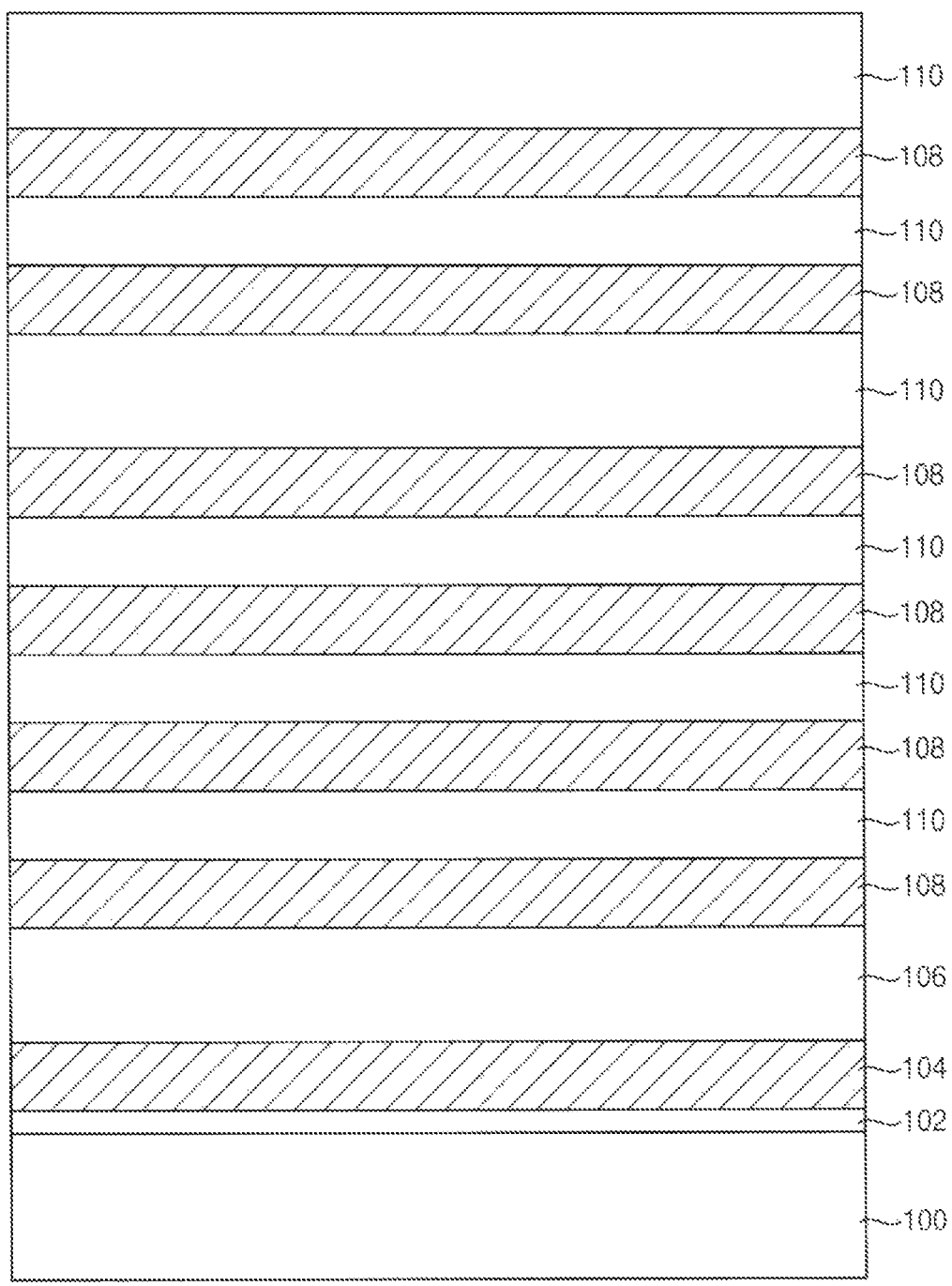

Referring to FIG. 4, pad insulation layer 102 may be formed on a semiconductor substrate 100. A lower sacrificial layer 104 may be formed on the pad insulation layer 102. A first insulation layer 106 may be formed on the lower sacrificial layer 104. A sacrificial layer 108 and a second insulation layer 110 may be alternately and repeatedly formed on the first insulation layer 106.

In example embodiments, the lower sacrificial layer 104 may be provided as a mold layer for forming a ground selection line. The sacrificial layers 108 may be provided as a mold layer for forming a word line and a string selection line.

In example embodiments, the pad insulation layer 102 may have a thickness in the first direction less than the first insulation layer 106 and the second insulation layers 110. The first insulation layer 106 may have a thickness in the first direction greater than the second insulation layers 110.

The pad insulation layer 102, the first insulation layer 106 and the second insulation layers 110 may include silicon oxide. The lower sacrificial layer 104 and the sacrificial layers 108 may include silicon nitride.

The pad insulation layer 102, the first insulation layer 106, the second insulation layers 110, the lower sacrificial layer 101 and the sacrificial layers 108 may be formed by, for example, a chemical vapor deposition (CVD) process, an atomic layer deposition process (ALD) process, etc. As an example, the pad insulation layer 102 may be formed by a thermal oxidation process.

Referring to FIGS. 5 and 6, an etching mask pattern (not illustrated) may be formed on the uppermost second insulation layer 110, and the second insulation layers 110, the sacrificial layers 108, the first insulation layer 106, the lower sacrificial layer 104 and the pad insulation layer 102 may be etched using the etching mask pattern, to form a plurality of channel holes 112 which expose a top surface of the semiconductor substrate 100. In example embodiments, the top surface of the semiconductor substrate 100 may be partially etched. The channel holes 112 may be arranged in each cell block. A plurality of the channel holes 112 may be arranged in the second and third directions in one cell block.

Figure 7:
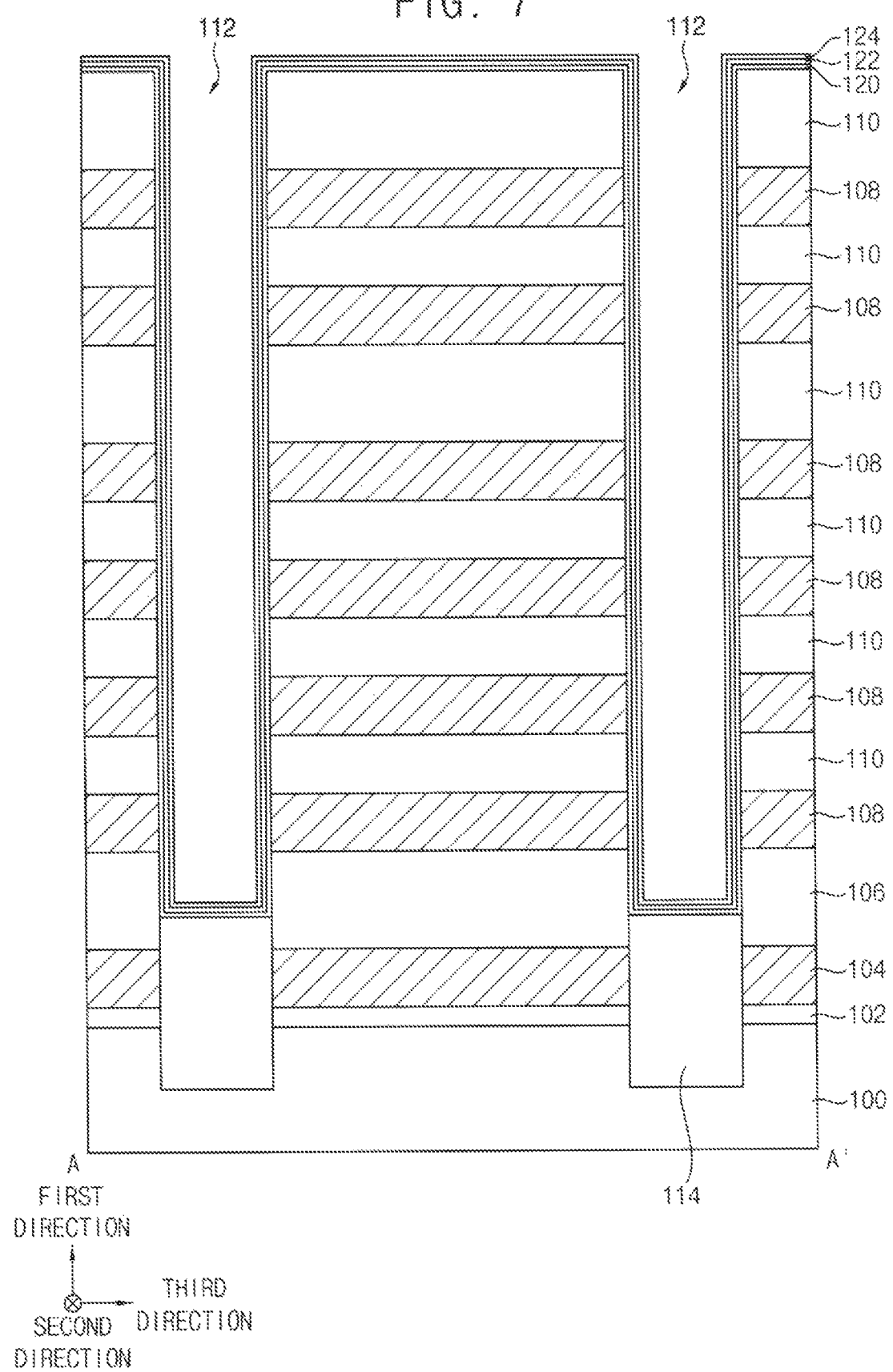

Referring to FIG. 7, a semiconductor pattern 114 may be formed to partially fill a lower portion of each of the channel holes 112. The semiconductor pattern 114 may be formed on the semiconductor substrate 100 exposed through each of the channel holes 112. A first blocking layer 120, a charge storage layer 122 and a tunnel insulation layer 124 may be sequentially formed conformally on a sidewall of the channel hole 112, the top surface of the semiconductor pattern 114, and the uppermost second insulation layer 110.

For example, a selective epitaxial growth (SEG) process may be performed using the exposed top surface of the semiconductor substrate 100 by the channel holes 122 as a seed to form the semiconductor pattern 114 partially filling the channel holes 112. The semiconductor pattern 114 may be formed to include single crystalline silicon or single crystalline germanium and, in some cases, n type or p type impurities may be doped hereinto.

In example embodiments, the semiconductor pattern 114 may be provided as a channel pattern of a lowermost ground selection transistor. Therefore, a top surface of the semiconductor pattern 114 may be formed to be positioned between a top surface and a bottom surface of the first insulation layer 106. Because the first insulation layer 106 has the thickness greater than the second insulation layer 110 formed thereon, the semiconductor pattern 114 may be formed by the epitaxial growth process such that the top surface of the semiconductor pattern 114 may be positioned between the top surface and the bottom surface of the first insulation layer 106.

In example embodiments, the first blocking layer 120 may be formed to include silicon oxide, the charge storage layer 122 may be formed to include silicon nitride, and the tunnel insulation layer 124 may be formed to include silicon oxide. The first blocking layer 120, the charge storage layer 122 and the tunnel insulation layer 124 may be formed by a chemical vapor deposition process or an atomic layer deposition process.

Figure 8:
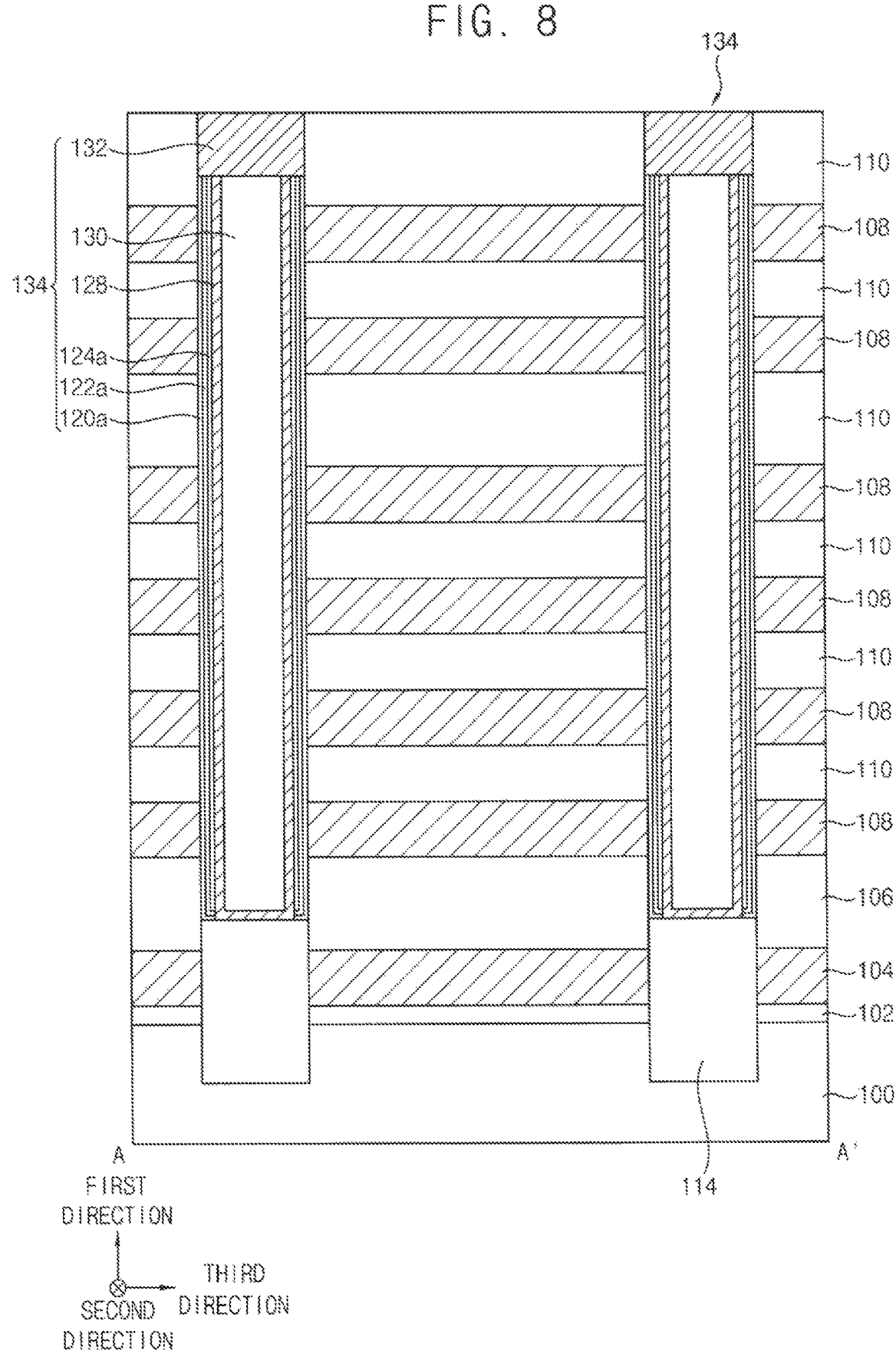

Referring to FIG. 8, a channel structure 134 may be formed on the semiconductor pattern 114 to fill the channel hole 112. The channel structure 134 may include a first blocking pattern 120a, a charge storage pattern 122a, a tunnel insulation pattern 124a, a channel pattern 128, a buried insulation pattern 130 and a pad pattern 132.

For example, the tunnel insulation layer 124, the charge storage layer 122 and the first blocking layer 120 may be anisotropically etched sequentially, to form the first tunnel insulation pattern 124a, the charge storage pattern 122a and the first blocking pattern 120a on the sidewall of the channel hole 112.

In the etch process, portions of the tunnel insulation layer 124, the charge storage layer 122 and the first blocking layer 120 formed on the semiconductor pattern 114 and the second insulation layer 110 may be removed. Accordingly, the top surface of the semiconductor pattern 114 may be exposed within the channel hole 112.

In example embodiments, before performing the anisotropic etch process, a process of forming a protection spacer (not illustrated) on the tunnel insulation layer 124 formed on the sidewall of the channel hole 112 may be further performed. During the etch process, the protection spacer may protect the tunnel insulation layer 124, the charge storage layer 122 and the first blocking layer 120 on the sidewall of the channel hole 112. After performing the anisotropic etch process, the protection spacer may be removed.

In example embodiments, a channel layer may be formed conformally on the semiconductor pattern 114, the tunnel insulation pattern 124a and the second insulation layer 110, and a buried insulation layer may be formed on the channel layer to completely fill the channel holes 112. The buried insulation layer and the channel layer may be planarized until the top surface of the second insulation layer 110 is exposed. Accordingly, the channel pattern 128 and the buried insulation pattern 130 may be formed. The channel pattern 128 may have a cylindrical shape making contacting with the semiconductor pattern 114. The buried insulation pattern 130 may have a pillar shape.

In some example embodiments, a channel layer may be formed on the semiconductor pattern 114, the tunnel insulation pattern 124a and the second insulation layer 110 to completely fill the channel hole 112, and the channel layer may be planarized until the top surface of the second insulation layer 110 is exposed, to form a channel pattern. In example embodiments, the channel pattern may have a pillar shape, and the buried insulation pattern may not be formed.

Then, upper portions of the channel pattern 128, the buried insulation pattern 130, the tunnel insulation pattern 124a, the charge storage pattern 122a and the first blocking pattern 120a may be removed to form an opening, and a conductive material may be formed in the opening to form the pad pattern 132. The pad pattern 132 may include polysilicon.

Referring to FIGS. 9 and 10, the second insulation layers 110, the sacrificial layer 108, the first insulation layer 106, the lower sacrificial layer 104 and the pad insulation layer 102 may be partially removed to form a trench 140 which exposes the top surface of the semiconductor substrate 100.

In example embodiments, the trench 140 may be formed to extend in the second direction, and a plurality of the trenches 140 may be arranged along the third direction. The cell block region may be separated by the trench 140.

As the trench 140 is formed, a mold structure including the pad insulation pattern 102a, the lower sacrificial pattern 104a, the first insulation pattern 106a, the sacrificial patterns 108a and the second insulation patterns 110a may be formed. The mold structure may extend in the second direction.

The second insulation patterns 110a, the sacrificial patterns 108a, the first insulation pattern 106a, the lower sacrificial pattern 104a and the pad insulation pattern 102a may be exposed through a sidewall of the trench 140.

Figure 11:
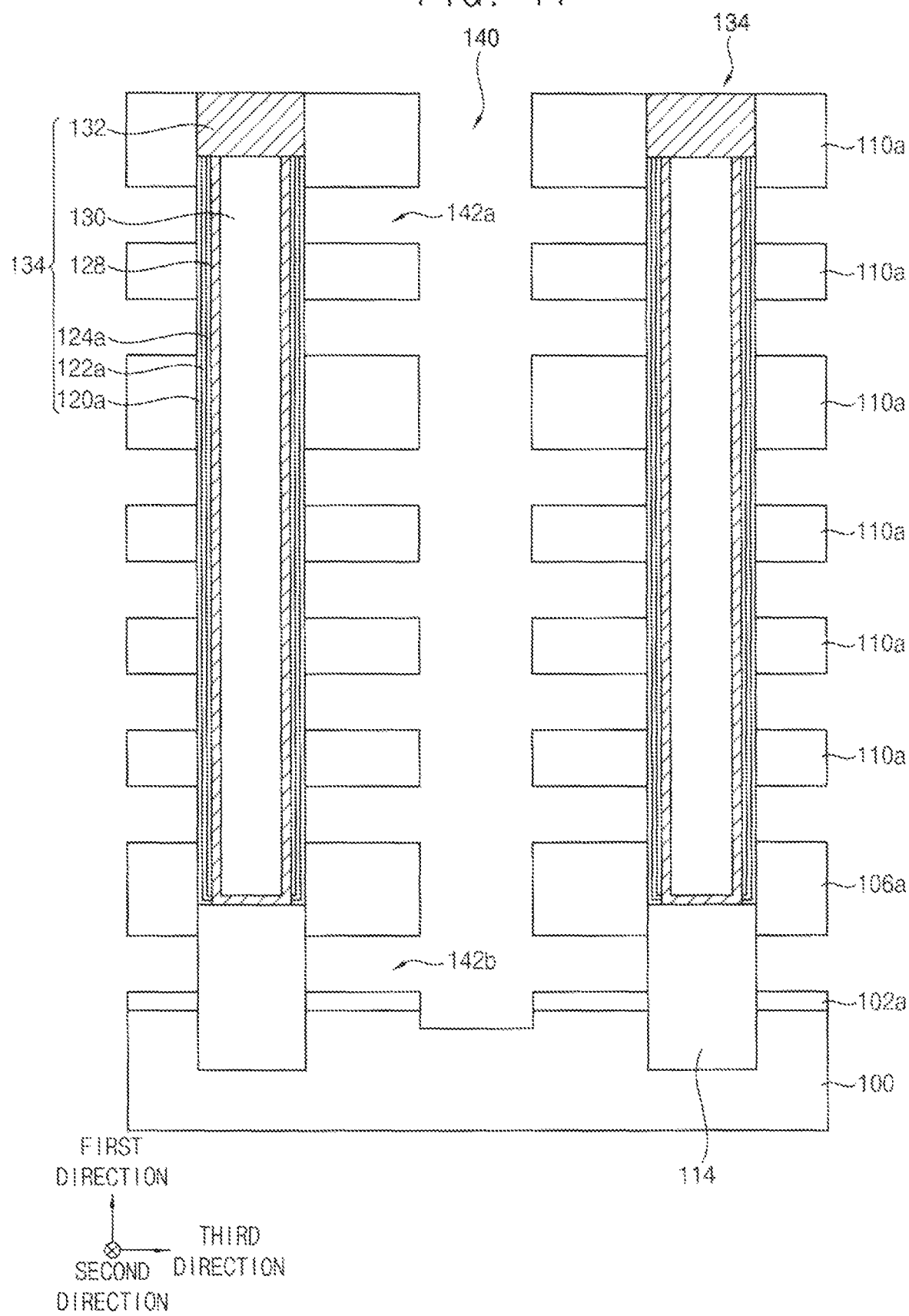

Referring to FIG. 11, the lower sacrificial pattern 104a and the sacrificial patterns 108a exposed by the trench 140 may be selectively removed. Accordingly, first gaps 142a may be formed between the second insulation patterns 110a and between the first insulation pattern 106a and the second insulation pattern 110a respectively, and a second gap 142b may be formed between the pad insulation pattern 102a and the first insulation pattern 106a.

The process of selectively removing the lower sacrificial pattern 104a and the sacrificial patterns 108a may include an isotropic etch process. In example embodiments, the sacrificial patterns 108a and the lower sacrificial pattern 104a exposed by the trench 140 may be removed by a wet etch process using an etching solution including phosphoric acid or sulfuric acid.

The ground selection line may be formed in the lowermost second gap 142b by a following process. A portion of the sidewall of the semiconductor pattern 114 may be exposed by the second gap 142b. The word lines and the string selection lines may be formed in the first gaps 142a by a following process. The first blocking pattern 120a of the channel structure 134 may be exposed by the first gap 142a.

Figure 12:
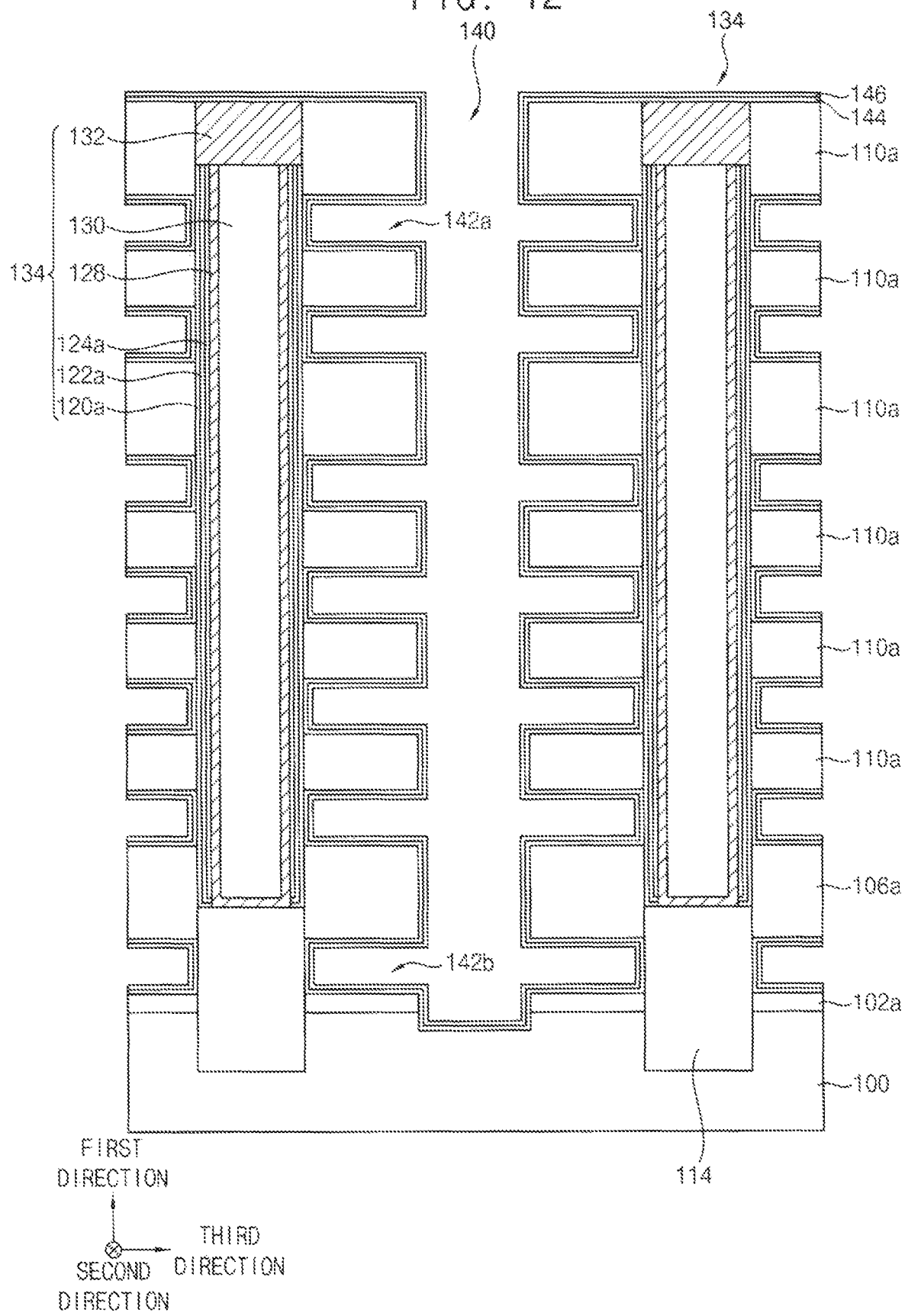

Referring to FIG. 12, a second blocking layer 144 may be formed conformally on the pad insulation pattern 102a, the semiconductor pattern 114, the first insulation pattern 106a, the second insulation patterns 110a, the first blocking pattern 120a exposed by the trench 140 and the first and second gaps 142a, 142b. A barrier layer 146 may be formed on the second blocking layer 144.

In example embodiments, the second blocking layer 144 may be formed to include a metal oxide such as aluminum oxide, hafnium oxide, zirconium oxide, etc. The barrier layer 146 may be formed to include titanium nitride, tantalum nitride, titanium, tantalum, etc.

As the second blocking layer 144 and the barrier layer 146 are formed, an inner width in the first direction of each of the first and second gaps 142a, 142b may be decreased.

Figure 13:
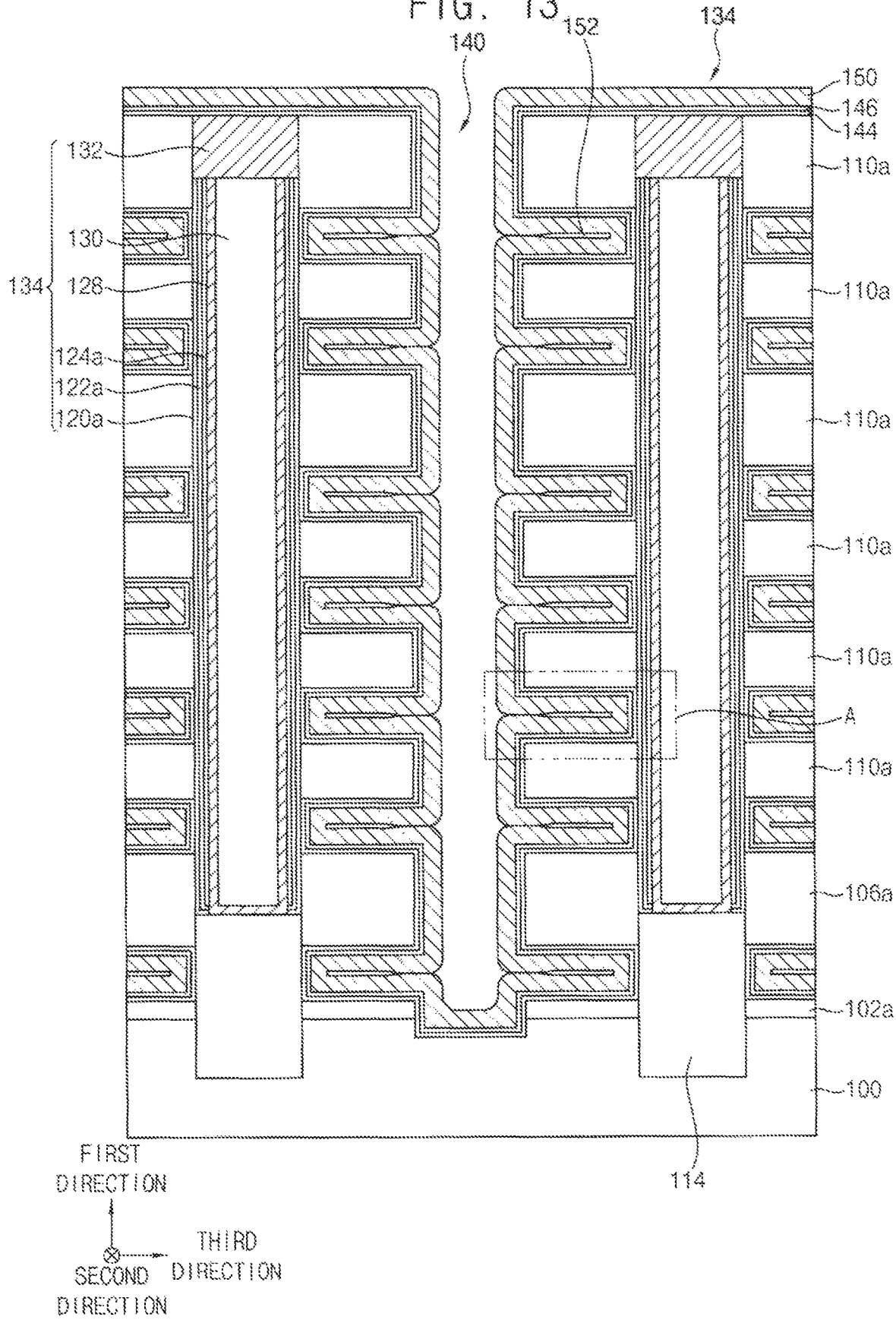
Figure 14:
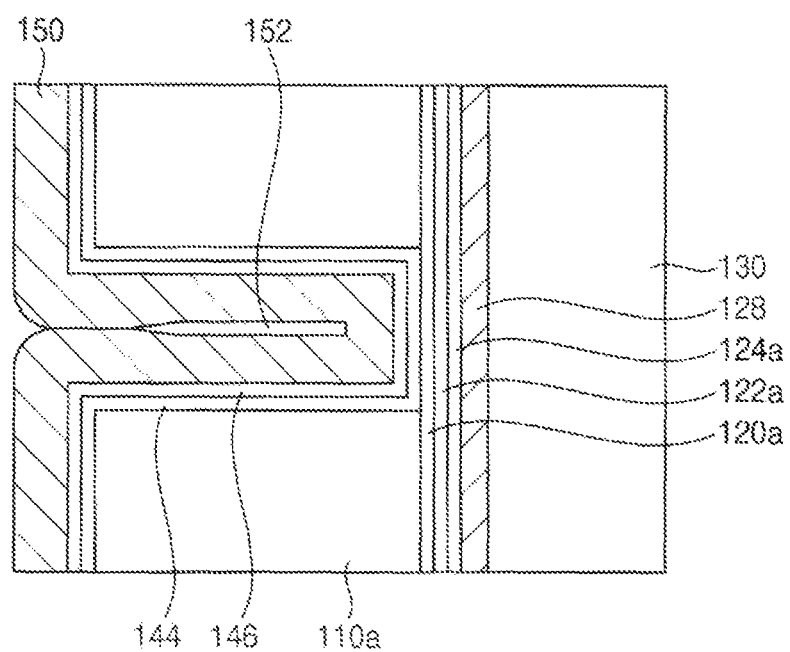

Referring to FIGS. 13 and 14, a first conductive layer 150 may be formed on the barrier layer 146 to fill the first and second gaps 142a, 142b. The first conductive layer 150 may include a metal material. For example, the first conductive layer 150 may be formed to include tungsten.

For example, the first conductive layer 150 may be formed by a chemical vapor deposition process or an atomic layer deposition process. The first conductive layer 150 may be deposited along a profile of the underlying layer to have a uniform thickness. Accordingly, the conductive layer 150 may be formed on the sidewall and a bottom surface of the trench 140 and a first portion, a second portion and a third portion of each of the first and second gaps 142a, 142b. Therefore, as the first conductive layer 150 may be formed on the barrier layer 146 to have the thickness of about at least a half of the inner width in the first direction of the first and second gaps 142a, 142b, the first and second gaps 142a, 142b may be filled with the first conductive layer 150.

However, because the inner width of the first and second gaps 142a, 142b is relatively small, deposition sources gases for forming the first conductive layer 150 may not easily flow into the first and second gaps 142a, 142b. Before the first conductive layer 150 is formed to have a sufficient thickness to completely fill the first and second gaps 142a, 142b, a portion of the first conductive layer 150 formed on an entrance of the first and second gaps 142a, 142b in communication with the trench 140 may be formed relatively thicker. In example embodiments, the entrance of the first and second gaps 142a, 142b may be closed by the first conductive layer 150. When the entrance of the first and second gaps 142a, 142b is closed, the deposition source gases may not flow into the first and second gaps 142a, 142b any more, so that the inner spaces of the first and second gaps 142a, 142b may not be completely filled with the first conductive layer 150. Accordingly, a slit 152, which is a long and thin void in a direction parallel with the top surface of the semiconductor substrate 100, may be formed in the first and second gaps 142a, 142b. The slit 152 may be formed in a middle region of each of the first and second gaps 142a, 142b in the first direction. In example embodiments, a width in the first direction of the slit 152 at the entrance of the first and second gaps 142a, 142b adjacent to the trench 140 may be relatively narrower.

Figure 15:
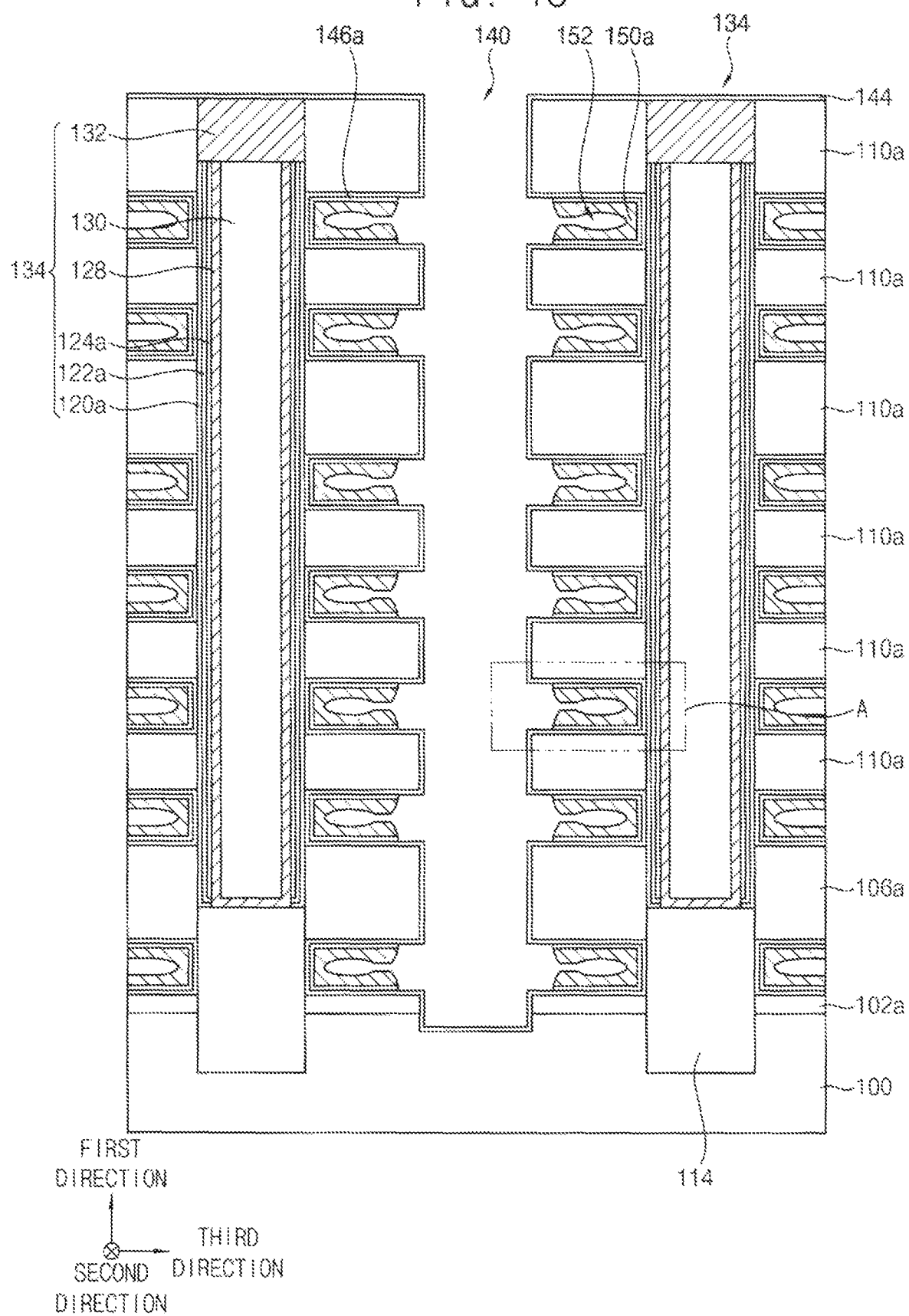
Figure 16:
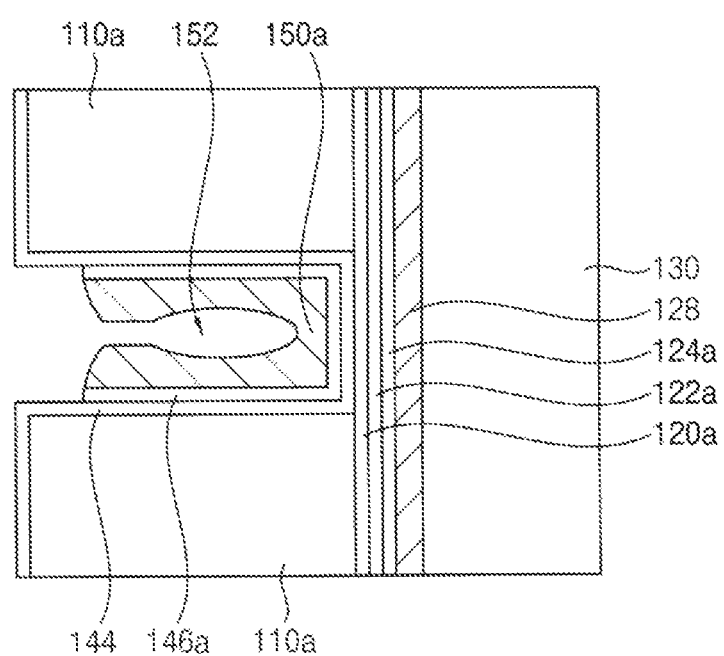

Referring to FIGS. 15 and 16, the first conductive layer 150 and the barrier layer 146 may be partially etched to form a first conductive pattern 150a and a barrier pattern 146a in the first and second gaps 142a, 142b.

For example, in the etch process, portions of the first conductive layer 150 and the barrier layer 146 formed on the second insulation patterns 110a, the first insulation pattern 106a, the pad insulation pattern 102a and the semiconductor substrate 100 may be removed. Accordingly, the second blocking layer 144 on the second insulation pattern 110a, the first insulation pattern 106a, the pad insulation pattern 102a and the semiconductor substrate 100 may be exposed. Additionally, portions of the first conductive layer 150 and the barrier layer 146 formed on the entrance of the first and second gaps 142a, 142b may be removed. Accordingly, the first conductive pattern 150a and the barrier pattern 146a may be formed. The etch process may include an isotropic etch process.

In the etch process, the portion of the first conductive layer 150 having a relatively greater thickness at the entrance of the first and second gaps 142a, 142b may be removed, to open an inner space of the slit 152. Accordingly, the slit 152 may be in communication with the trench 140.

In example embodiments, the first conductive pattern 150a may be formed along the first portion, the second portion and the third portion of each of the first and second gaps 142a, 142b, and may include the slit 152 between the first portion and the third portion. That is, the first conductive pattern 150a may remain on the sidewalls of the semiconductor pattern 114 exposed by the second gap 142b and the channel structure 134 exposed by the first gap 142a.

Figure 17:
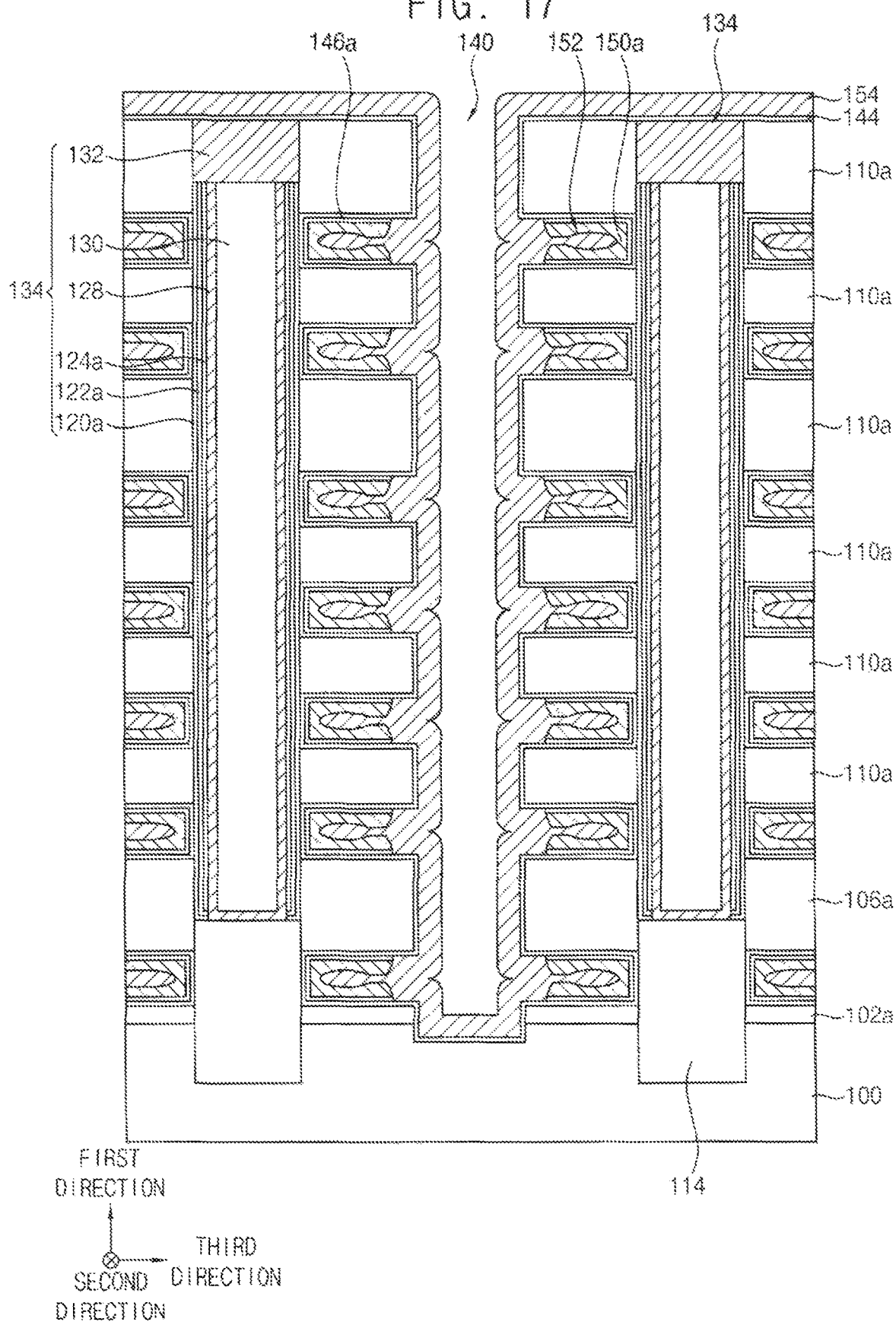

Referring to FIG. 17, a second conductive layer 154 may be formed on the exposed second blocking layer 144, the barrier pattern 146a and the first conductive pattern 150a. The second conductive layer 154 may completely fill the slit 152 of the first conductive pattern 150a. The second conductive layer 154 may be formed along the sidewall and the bottom surface of the trench 140 to partially fill the trench 140.

The second conductive layer 154 may be formed by a chemical vapor deposition process or an atomic layer deposition process.

The second conductive layer 154 may include a material capable of fill the narrow slit 152. The second conductive layer 154 may include a material different from the first conductive pattern 150a. In example embodiments, the second conductive layer 154 may include titanium, titanium nitride, tantalum, tantalum nitride, etc. The second conductive layer 154 may include, for example, titanium nitride.

Figure 18:
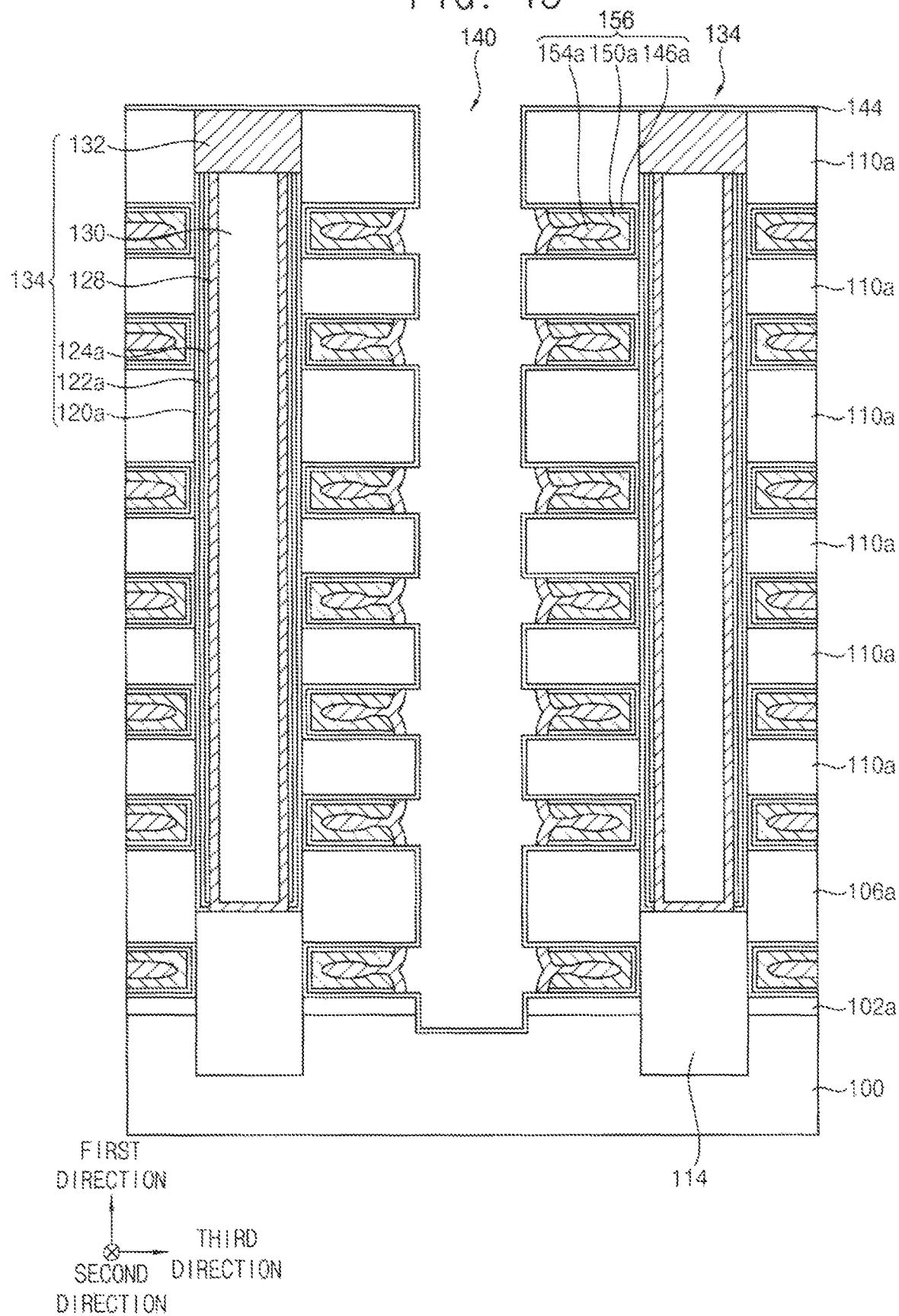
Figure 19:
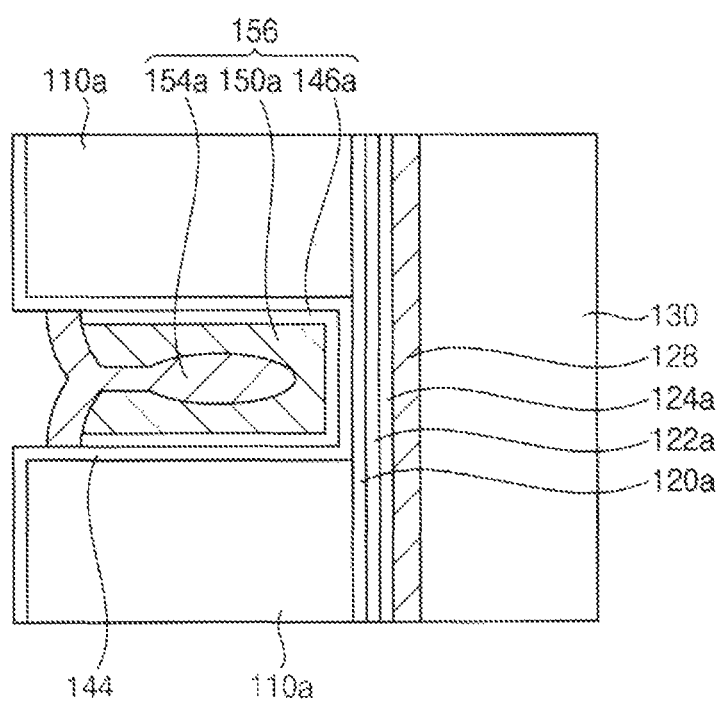

Referring to FIGS. 18 and 19, the second conductive layer 154 may be partially etched to form a second conductive pattern 154a on the first conductive pattern 150a and the barrier pattern 146a. The second conductive pattern 154a may be formed in the first and second gaps 142a, 142b.

For example, in the etch process, portions of the second conductive layer 154 formed on the second insulation patterns 110a, the first insulation pattern 106a, the pad insulation pattern 102a and the semiconductor substrate 100 may be removed, so that the second blocking layer 144 may be exposed. Additionally, a portion of the second conductive layer 154 formed on the entrance of the first and second gaps 142a, 142b may be removed. The etch process may include an isotropic etch process.

By performing the isotropic etch process, a gate structure 156 including the barrier pattern 146a, the first conductive pattern 150a and the second conductive pattern 154a may be formed in the first and second gaps 142a, 142b.

The second conductive pattern 154a may cover an upper surface of the first conductive pattern and may fill the slit. As the second conductive pattern 154a is formed, the slit may be removed from the gate structure 156.

In case that the gate structure includes the slit, deposition gasses and/or hydrogen gases have not escaped from the slit to remain in the slit. The above and underlying insulation patterns may be partially etched by the remaining gases, thereby causing a crack in the insulation pattern and inclination of the insulation pattern. Further, in case that the gate structure includes the slit, the above and underlying insulation patterns may become structurally unstable, so that the insulation pattern may be inclined downwardly or broken. As such, when the above and underlying insulation patterns are not formed to be stable, gate structures formed on and under the insulation pattern may be electrically connected to each other, thereby causing a short failure between two gate structures. However, according to example embodiments, because the slit is removed by the second conductive pattern 154a, the above and underlying insulation pattern may have a stable structure, to thereby reduce or prevent a failure.

Figure 20:
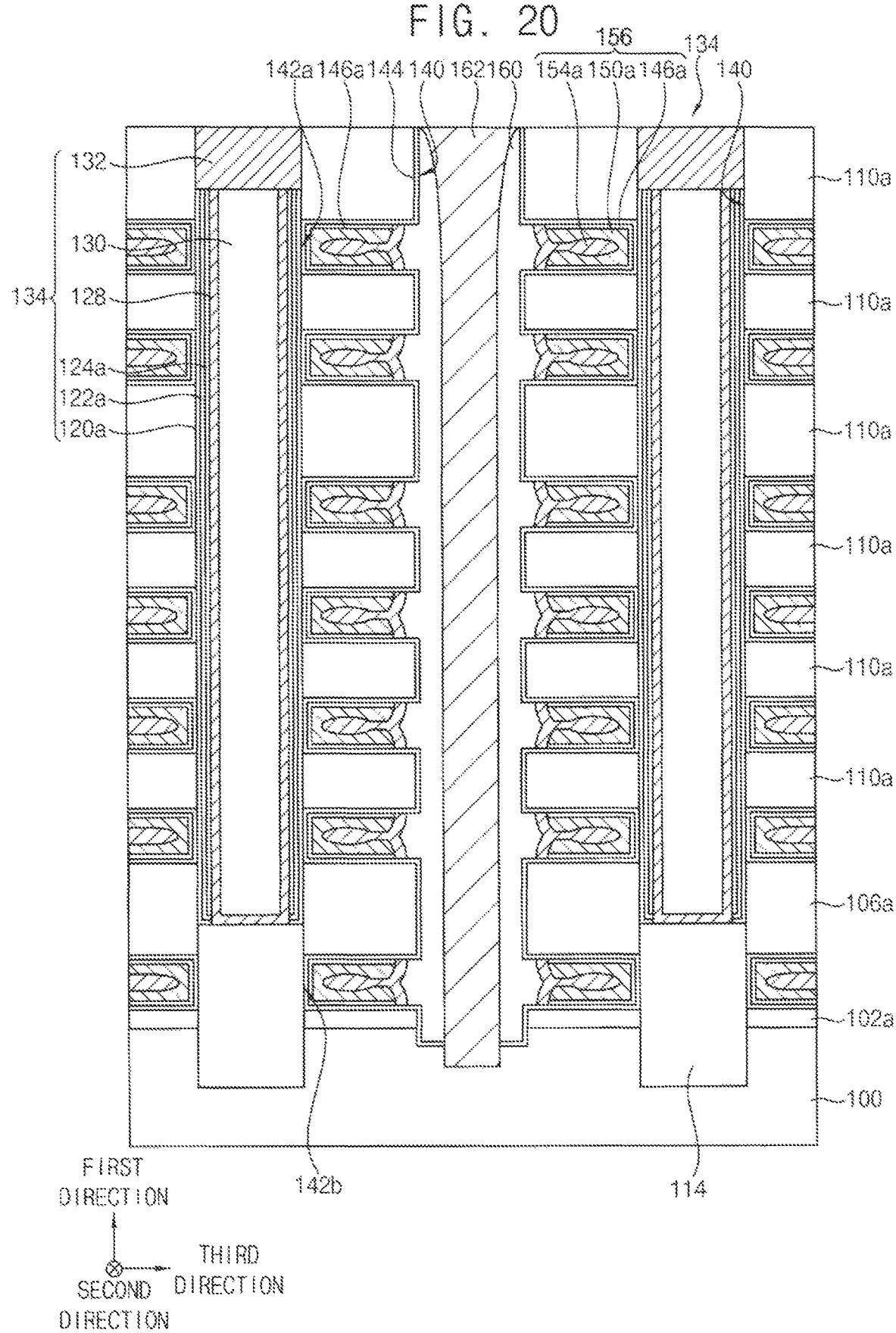

Referring to FIG. 20, an insulation spacer layer may be formed on the second blocking layer 144 and the second conductive pattern 154a. The insulation spacer layer may be anisotropically etched to form an insulation spacer 160 on the sidewall of the trench 140.

Then, the insulation spacer 160 may be used as an etching mask to etch the second blocking layer 144 which is not covered by the insulation spacer 160. Accordingly, portions of the second blocking layer 144 on the second insulation pattern 110a and the semiconductor substrate 100 may be removed.

A conductive layer may be formed on the insulation spacer 160, the semiconductor substrate 100 and the second insulation pattern 110a to fill the trench. The conductive layer may be planarized until the top surface of the second insulation pattern 110a is exposed, to form a common source line 162 in the trench. The common source line 162 may include tungsten. The common source line 162 may extend in the second direction.

The, although it is not illustrated in the figure, an upper insulation layer may be formed on the common source line 162 and the insulation spacer 160, and then, a contact plug may be formed to penetrate through the upper insulation layer to make contact with the pad pattern. A bit line may be formed to make contact with the contact plug.

The above processed may be performed to manufacture a vertical type semiconductor device.

Figure 21:
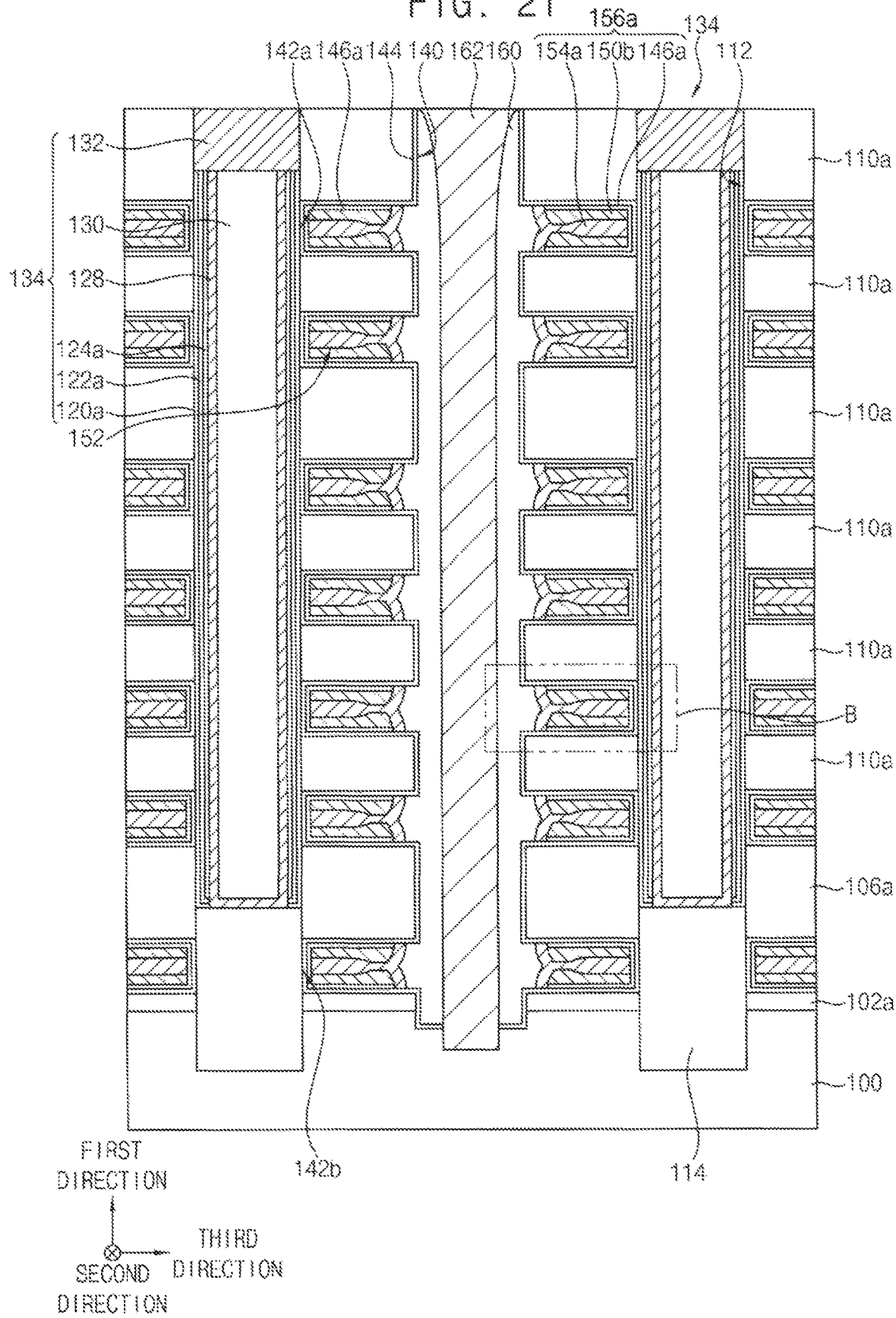
Figure 22:
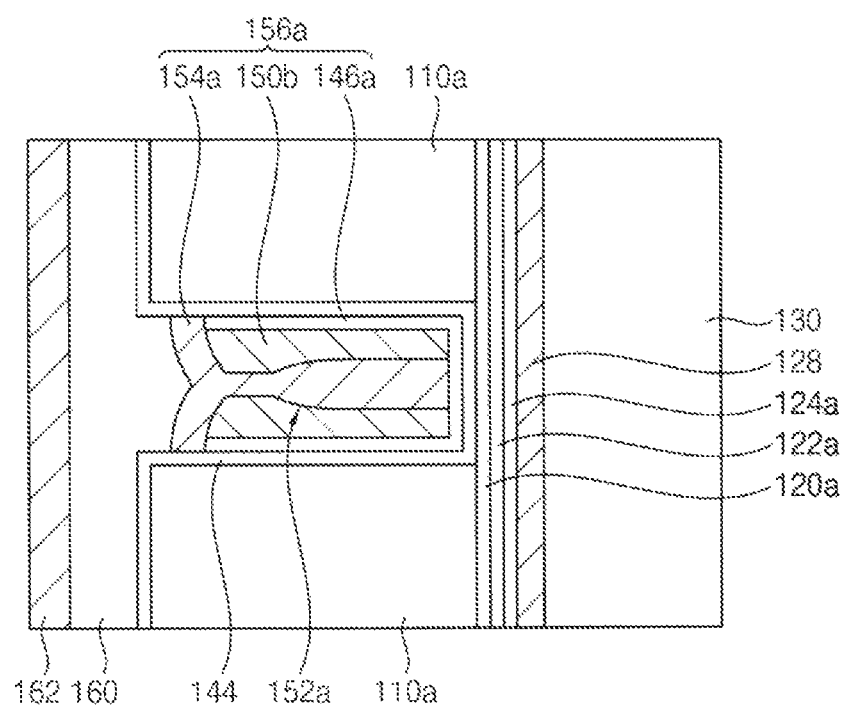

FIGS. 21 and 22 are cross-sectional views illustrating a vertical type semiconductor device in accordance with example embodiments.

FIG. 22 is an enlarged cross-sectional view illustrating a portion "B" in FIG. 21.

The vertical type semiconductor device illustrated in FIGS. 21 and 22 may be substantially the same as the vertical type semiconductor device as described with reference to FIGS. 1, 2A, 2B and 3, except a shape of a gate structure.

Referring to FIGS. 21 and 22, a gate structure 156a may include a barrier pattern 146a, a first conductive pattern 150b and a second conductive pattern 154a.

The barrier pattern 146a may be provided along a first portion, a second portion and a third portion of each of the first and second gaps 142a, 142b.

The first conductive pattern 150b may be provided only on the first portion and third portion in the first and second gaps 142a, 142b. A slit 152a may be provided between the first and second portions. That is, the first conductive pattern 150b may not be formed on a portion of the sidewalls of the semiconductor pattern 114 exposed by the second gap 142b and the channel structure 134 exposed by the first gap 142a. Accordingly, a portion of the barrier pattern 146a on the second portion of each of the first and second gaps 142a, 142b may be exposed by the first conductive pattern 150b.

The second conductive pattern 154a may be provided on the barrier pattern 146a and the first conductive pattern 150b. The second conductive pattern 154a may fill the slit 152a.

The vertical type semiconductor device may be manufactured by processes substantially the same as the processes described with reference to FIGS. 4 to 20.

Figure 23:
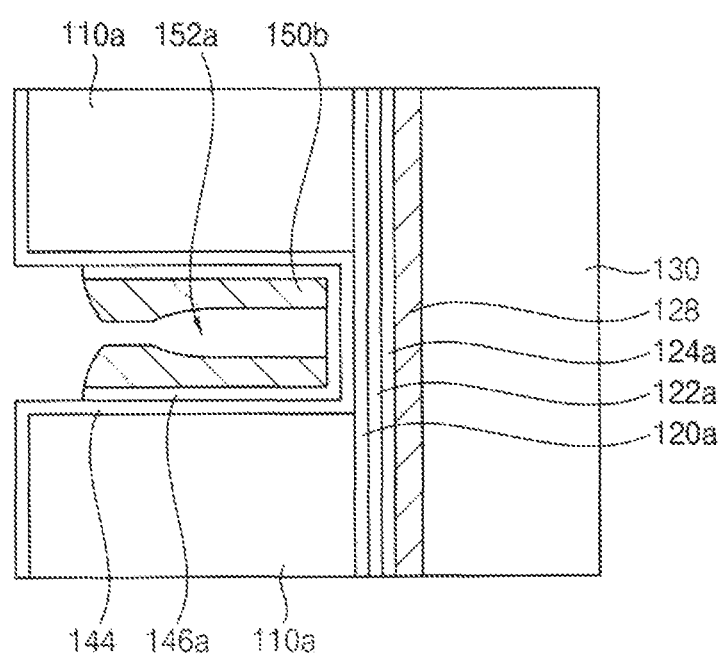

But when the processes described with reference to FIGS. 15 and 16, as illustrated in FIG. 23, portions of the first conductive layer on the sidewalls of the semiconductor pattern 114 exposed by the second gap 142b and the channel structure 134 exposed by the first gap 142a may be removed.

According to a vertical type semiconductor device in accordance with example embodiments, a failure occurring due to a gate structure may be reduced or prevented. The vertical type semiconductor device may be applied to various electronic products.

While example embodiments have been particularly shown and described, it will be understood by one of ordinary skill in the art that variations in form and detail may be made therein without departing from the spirit and scope of the claims.

What is claimed is:

1. A vertical type semiconductor device, comprising:
    insulation patterns on a substrate and spaced apart from each other in a first direction perpendicular to a top surface of the substrate;
    a channel structure on the substrate and penetrating through the insulation patterns;
    a first conductive pattern partially filling a gap between the insulation patterns adjacent to each other in the first direction and the channel structure and having a slit in a surface thereof, the slit extending towards the channel structure and parallel with the top surface of the substrate; and
    a second conductive pattern on the first conductive pattern in the gap and filling the slit,
    wherein a width at an entrance of the slit in the first direction is less than a width of an inner space of the slit in the first direction.

2. The vertical type semiconductor device of claim 1, wherein the first conductive pattern comprises a metal material.

3. The vertical type semiconductor device of claim 1, wherein the first conductive pattern comprises tungsten.

4. The vertical type semiconductor device of claim 1, wherein the second conductive pattern comprises titanium, titanium nitride, tantalum or tantalum nitride.

5. The vertical type semiconductor device of claim 1, further comprising a barrier pattern surrounding a top surface, a sidewall and a bottom surface of the first conductive pattern.

6. The vertical type semiconductor device of claim 1, wherein the gap is defined as a space between surfaces of the above and underlying insulation patterns adjacent to each other in the first direction and the channel structure, the first conductive pattern is along a top surface of the underlying insulation pattern, the channel structure and a bottom surface of the above insulation pattern, and the slit is between the first conductive patterns on the top surface of the underlying insulation pattern and the bottom surface of the above insulation pattern.

7. The vertical type semiconductor device of claim 1, wherein the slit is in a middle region of the gap in the first direction.

8. The vertical type semiconductor device of claim 1, wherein a gate structure including the first and second conductive patterns extends in a second direction parallel with the top surface of the substrate.

9. The vertical type semiconductor device of claim 8, wherein a plurality of the gate structures is arranged in a third direction perpendicular to the second direction and parallel with the top surface of the substrate, and a trench extends in the second direction between the gate structures and exposes the substrate.

10. The vertical type semiconductor device of claim 9, wherein the entrance of the slit adjacent to the trench is opened toward the trench.

11. The vertical type semiconductor device of claim 10, wherein the entrance of the slit has a width in the first direction less than other portions of the slit.

12. The vertical type semiconductor device of claim 9, further comprising:
    an insulation spacer on a sidewall of the trench to cover the second conductive pattern; and
    a common source line on the insulation spacer to fill the trench.

13. The vertical type semiconductor device of claim 1, wherein the first conductive pattern has a shape surrounding the channel structure when a middle region in the first direction of a gate structure is viewed in a plan.

14. The vertical type semiconductor device of claim 1, further comprising a semiconductor pattern between the substrate and the channel structure.

15. A vertical type semiconductor device, comprising:
insulation patterns on a substrate and spaced apart from each other in a first direction perpendicular to a top surface of the substrate, the insulation pattern extending a second direction parallel to the top surface of the substrate;
channel structures on the substrate, each channel structure penetrating through the insulation patterns; and
a gate structure in a gap between the insulation patterns adjacent to each other in the first direction and the channel structure, the gate structure extending in the second direction,
the gate structure comprising:
a first conductive pattern along a top surface and a bottom surface of the insulation patterns and the channel structure and having a slit in a surface thereof; and
a second conductive pattern on the first conductive pattern to fill the slit and including a material different from the first conductive pattern,
wherein a width at an entrance of the slit in the first direction is less than a width of an inner space of the slit in the first direction.

16. The vertical type semiconductor device of claim 15, wherein a plurality of the gate structures is arranged in a third direction perpendicular to the second direction and parallel with the top surface of the substrate, and a trench extends in the second direction between the gate structures and exposes the substrate.

17. The vertical type semiconductor device of claim 15, wherein an entrance of the slit adjacent to a trench is opened toward the trench.

18. A vertical type semiconductor device, comprising:
pattern structures including gate structures and insulation patterns alternately and repeatedly stacked on a substrate in a first direction perpendicular to a top surface of the substrate;
channel structures penetrating through the insulation patterns; and
a common source line between the pattern structures, extending in a second direction parallel with the top surface of the substrate and contacting the substrate, the gate structure comprising:
a first conductive pattern having a slit parallel with the top surface of the substrate; and
a second conductive pattern on the first conductive pattern filling the slit,
wherein a width at an entrance of the slit in the first direction is less than a width of an inner space of the slit in the first direction.

19. The vertical type semiconductor device of claim 18, wherein the first conductive pattern comprises tungsten, and the second conductive pattern comprises titanium, titanium nitride, tantalum or tantalum nitride.

20. The vertical type semiconductor device of claim 18, wherein an entrance of the slit is opened toward the common source line.

* * * * *